(12) United States Patent
Cassella et al.

(10) Patent No.: US 11,784,623 B2
(45) Date of Patent: Oct. 10, 2023

(54) TWO DIMENSIONAL ROD RESONATOR FOR RF FILTERING

(71) Applicant: Northeastern University, Boston, MA (US)

(72) Inventors: Cristian Cassella, Boston, MA (US); Xuanyi Zhao, Brookline, MA (US)

(73) Assignee: Northeastern University, Boston, MA (US)

( * ) Notice: Subject to any disclaimer, the term of this patent is extended or adjusted under 35 U.S.C. 154(b) by 224 days.

(21) Appl. No.: 17/097,289

(22) Filed: Nov. 13, 2020

(65) Prior Publication Data

US 2021/0152146 A1  May 20, 2021

Related U.S. Application Data

(60) Provisional application No. 62/935,769, filed on Nov. 15, 2019, provisional application No. 62/984,426, filed on Mar. 3, 2020.

(51) Int. Cl.
| | |
|---|---|
| *H03H 9/02* | (2006.01) |
| *H03H 3/04* | (2006.01) |
| *H03H 9/17* | (2006.01) |
| *H03H 9/56* | (2006.01) |
| *H03H 9/13* | (2006.01) |

(52) U.S. Cl.
CPC ......... *H03H 9/02031* (2013.01); *H03H 3/04* (2013.01); *H03H 9/13* (2013.01); *H03H 9/176* (2013.01); *H03H 9/568* (2013.01); *H03H 2003/0435* (2013.01)

(58) Field of Classification Search
CPC ........ H03H 9/02031; H03H 3/04; H03H 9/13; H03H 9/176; H03H 9/568; H03H 2003/0435; H03H 9/02622; H03H 3/10; H03H 9/02047; H03H 9/02062; H03H 9/174; H03H 9/02228
USPC .......................................... 333/133, 193–196
See application file for complete search history.

(56) References Cited

U.S. PATENT DOCUMENTS

| | | | |
|---|---|---|---|
| 5,815,054 A | * | 9/1998 | Vojak .................. H03H 9/02543 333/191 |
| 2016/0003924 A1 | | 1/2016 | Rinaldi et al. |
| 2016/0065169 A1 | | 3/2016 | Rinaldi et al. |
| 2016/0099701 A1 | | 4/2016 | Rinaldi et al. |
| 2017/0102263 A1 | | 4/2017 | Berstein et al. |
| 2017/0126263 A1 | | 5/2017 | Rinaldi et al. |
| 2017/0163240 A1 | | 6/2017 | Rinaldi et al. |
| 2017/0170803 A1 | | 6/2017 | Rinaldi et al. |

(Continued)

OTHER PUBLICATIONS

Cassella et al., "Aluminum Nitride Cross Sectional Lame Mode Resonators", Journal of Microelectromechanical Systems, vol. 25, No. 2 (2016) pp. 275-285.

(Continued)

*Primary Examiner* — Rakesh B Patel
*Assistant Examiner* — Jorge L Salazar, Jr.
(74) *Attorney, Agent, or Firm* — Verrill Dana, LLP

(57) ABSTRACT

A microelectromechanical resonator device is provided having two-dimensional resonant rods. The resonator device has a piezoelectric layer formed with a plurality of alternating rods and trenches. A bottom electrode is in contact with a bottom surface of the piezoelectric layer. A top electrode metal grating of conductive strips is aligned in contact with corresponding rods of the piezoelectric layer.

13 Claims, 17 Drawing Sheets

(56) References Cited

U.S. PATENT DOCUMENTS

| | | |
|---|---|---|
| 2017/0187347 A1 | 6/2017 | Rinaldi et al. |
| 2017/0331450 A1 | 11/2017 | Rinaldi et al. |
| 2018/0083181 A1 | 3/2018 | Piazza et al. |
| 2018/0097499 A1 | 4/2018 | Rinaldi et al. |
| 2018/0138889 A1 | 5/2018 | Rinaldi et al. |
| 2018/0287047 A1 | 10/2018 | Rinaldi et al. |
| 2019/0006136 A1 | 1/2019 | Rinaldi et al. |
| 2019/0074813 A1* | 3/2019 | Zou .................... H03H 9/562 |
| 2019/0190484 A1* | 6/2019 | Fukuda ............. H03H 9/02897 |
| 2020/0116694 A1 | 4/2020 | Rinaldi et al. |
| 2020/0335294 A1 | 10/2020 | Rinaldi et al. |
| 2021/0111696 A1 | 4/2021 | Rinaldi et al. |

OTHER PUBLICATIONS

Cassella et al., "RF Passive Components Based on Aluminum Nitride Cross-Sectional Lamé-Mode MEMS Resonators", IEEE Transactions on Electron Devices, vol. 64, No. 1 (2017) pp. 237-243.

Cassella et al., "AlN Two-Dimensional-Mode Resonators for Ultra-High Frequency Application", IEEE Electron Device Letters, vol. 36, No. 11 (2015) pp. 1192-1194.

Cassella et al., "Super High Frequency Aluminum Nitride Two-Dimensional-Mode Resonators with kt2 Exceeding 4.9%", IEEE Microwave and Wireless Components Letters, vol. 27, No. 2 (Feb. 2017) pp. 105-107.

Cassella et al., "High kt2 Exceeding 6.4% Through Metal Frames in Aluminum Nitride 2-D Mode Resonators", IEEE Transactions on Ultrasonics, Ferroelectrics, and Frequency Control, vol. 66, No. 5, (2019) pp. 958-964.

Colombo et al., "Investigation of 20% Scandium-doped Aluminum Nitride Films for MEMS Laterally Vibrating Resonators", 2017 IEEE International Ultrasonics Symposium (IUS) (2017), pp. 1-4.

Ramezani et al., "High kt2•Q Silicon Fin Bulk Acoustic Resonators (FinBAR) for Chip-Scale Multi-Band Spectrum Analysis", 2018 IEEE Micro Electro Mechanical Systems (MEMS) (2018), pp. 158-161.

Nilchi et al., "High Cx/Co 13nm-Capacitive-Gap Transduced Disk Resonator", 2017 IEEE 30th International Conference on Micro Electro Mechanical Systems (MEMS) (2017), pp. 924-927.

Cassella et al., "On the Origin of High Coupling Two-Dimensional Modes of Vibration in Aluminum Nitride Plates", 2018 IEEE International Frequency Control Symposium (IFCS) (2018), pp. 1-3.

Zhu et al., "A High Coupling Coefficient 2.3-GHz AlN Resonator for High Band LTE Filtering Application", IEEE Electron Device Letters, vol. 37, No. 10 (2016) pp. 1344-1346.

Lamb, H., "On the Reflection and Transmission of Electric Waves by a Metallic Grating", Proceedings of the London Mathematical Society, s1-29 (1898) pp. 523-546.

Zuo et al., "Cross-Sectional Dilation Mode Resonator with Very High Electromechanical Coupling up to 10% using AlN", 2012 IEEE International Frequency Control Symposium Proceedings (2012), pp. 1-4.

Southin et al., "Finite Element Modelling of Nanostructured Piezoelectric Resonators (NAPIERs)", IEEE Transactions on Ultrasonics, Ferroelectrics, and Frequency Control, vol. 51, No. 6, (2004) pp. 654-662.

Hashimoto et al., "Analysis of Excitation and Propagation of Acoustic Waves Under Periodic Metallic-Grating Structure for SAW Device Modeling", 1993 Proceedings IEEE Ultrasonics Symposium, vol. 1 (1993) pp. 143-148. doi.org/10.1109/ULTSYM.1993.339689.

Qian et al., Effects of Bottom Electrode Topography in AlN Nano Plate Resonators on Quality Factor, 2018 IEEE International Frequency Control Symposium (IFCS) (2018), pp. 1 2.

Williams et al., "Theory of multiresonant metamaterials for AO Lamb waves", Phys. Rev. B 91, 104307 (2015), pp. 1-12.

* cited by examiner

TWO DIMENSIONAL ROD RESONATOR FOR RF FILTERING

CROSS REFERENCE TO RELATED APPLICATIONS

This application claims priority under 35 U.S.C. § 119(e) of U.S. Provisional Application No. 62/935,769, filed on 15 Nov. 2019, entitled "Two Dimensional Rod Resonator for RF Filtering," and of U.S. Provisional Application No. 62/984,426, filed on 3 Mar. 2020, entitled "Two Dimensional Rod Resonator for RF Filtering," the disclosures of which are hereby incorporated by reference.

STATEMENT REGARDING FEDERALLY SPONSORED RESEARCH OR DEVELOPMENT

N/A

BACKGROUND

In the last decades, acoustic resonators and filters based on aluminum nitride (AlN) film-bulk-acoustic-resonators (FBARs) have been largely used to form filters in commercial RF front-ends. Such devices excite a thickness-extensional (TE) mode of vibration. So, despite their high-$k_t^2$ (~7%), the resonance frequency ($f_{res}$) of FBARs is set by the thickness of their AlN plate, thus being lithographically tunable only through a large fabrication complexity. Recently, two-dimensional-mode-resonators (2DMRs) were discovered. 2DMRs excite a set of Lamb-waves, in suspended AlN plates. To do so, they rely on two identical metallic gratings connected to opposite voltage polarities. The use of these gratings is key to constrain the excited modes in the metallized AlN regions. However, since these modes are significantly coupled along the lateral direction, 2DMRs can only attain a $k_t^2$-value approaching 5%, thus not being suitable to form filters for wideband applications.

SUMMARY

A class of aluminum nitride resonators, labeled two-dimensional resonant rods (2DRRs), for operation in the radio-frequency (RF) range, is described, and a prototype is demonstrated. 2DRRs rely on the excitation of an array of locally resonant rods, micro-fabricated in thin-film AlN plates. With this technology, a low-impedance (($\omega C_0)^{-1} \approx 208\Omega$) 2DRR has been built, operating at 2.35 GHz and showing an electromechanical coupling coefficient ($k_t^2$), for lithographically defined AlN resonators, exceeding 7.4%. Such a high $k_t^2$-value, that matches closely the predicted value through finite element methods (FEM), can be attained while relying on an un-patterned bottom metal plate. This feature permits to simultaneously attain large capacitance values and an optimal AlN crystalline orientation. Moreover, as verified through FEM, the resonance frequency of 2DRRs can be lithographically tuned without a substantial degradation of $k_t^2$.

Further aspects include the following:
1. A resonator device comprising:
   a piezoelectric layer suspended from a substrate, the piezoelectric layer having a width direction, a length direction, and a thickness direction, the piezoelectric layer having a bottom surface and a top surface, the piezoelectric layer comprising a beam extending along the bottom surface continuously in the width direction and the length direction, a plurality of rod portions extending continuously in the length direction and upwardly from the beam to the top surface, the rod portions spaced apart in the width direction;
   a bottom electrode comprising a metal plate in contact with the bottom surface of the piezoelectric layer; and
   a top electrode comprising a metal grating comprising a plurality of conductive strips on the top surface of the piezoelectric layer, each of the conductive strips aligned in contact with a corresponding one of the rod portions of the piezoelectric layer;
   wherein the plurality of conductive strips and corresponding ones of the rod portions of the piezoelectric layer form a plurality of rods, and portions of the beam of the piezoelectric layer and the bottom electrode form a plurality of trenches between the rods.
2. The resonator device of 1, wherein a thickness of each of the rods is greater than a thickness of each of the trenches.
3. The resonator device of any of 1-2, wherein a thickness of each of the rod portions of the piezoelectric layer is greater than a thickness of the piezoelectric layer of each of the trenches.
4. The resonator device of any of 1-3, wherein each of the trenches has a depth in the thickness direction selected to constrain acoustic energy within the rods.
5. The resonator device of any of 1-4, wherein each of the rods has a width selected to provide a determined frequency.
6. The resonator device of any of 1-5, wherein each of the trenches has a width selected to optimize the determined frequency of the rods.
7. The resonator device of any of 1-6, wherein the rods and the trenches each have an equal width within ±1%.
8. The device of any of 1-7, further comprising circuitry in communication with the resonator device to apply an alternating voltage through the top electrode and the bottom electrode to excite one or more dilatational modes of mechanical vibration in the rods of the piezoelectric layer.
9. The resonator device of any of 1-8, wherein the piezoelectric layer is selected from aluminum nitride, lead zirconate titanate, lithium niobate, lithium tantalite, zinc oxide, gallium nitride, scandium nitride, aluminum scandium nitride, and quartz, and combinations thereof.
10. The resonator device of any of 1-9, wherein the top electrode and the bottom electrode are each selected from aluminum, platinum, ruthenium, molybdenum, tungsten, and gold, and combinations thereof.
11. The resonator device of any of 1-10, wherein the piezoelectric layer is aluminum nitride, the bottom electrode is platinum, and the top electrode is aluminum.
12. The resonator device of any of 1-11, wherein the device has an electromechanical coupling coefficient between electrical and acoustic energy of at least 7%.
13. A filter comprising the resonator device of any of 1-12, and electrical connections to the resonator device.
14. A radio frequency (RF) component including the resonator device of any of 1-13, and electrical connections to the resonator device, wherein the RF component is a filter, oscillator, synthesizer, sensor, coupler, or transformer.
15. A method of fabricating the resonator device of any of 1-14, comprising:
   forming a bottom metal layer on a substrate to form the bottom electrode;
   forming a piezoelectric material on the bottom metal layer;
   forming a top metal layer on the piezoelectric material comprising a grating of conductive strips to form the top electrode;

removing material from the piezoelectric material between the conductive strips of the top electrode to form the plurality of alternating rods and trenches; and releasing the bottom electrode, the piezoelectric material and the top electrode from the substrate.

16. A method of fabricating a resonator device, comprising:

forming a bottom metal layer on a substrate to form a bottom electrode;

forming a piezoelectric material on the bottom metal layer;

forming a top metal layer on the piezoelectric material comprising a grating of conductive strips to form a top electrode;

removing material from the piezoelectric material between the conductive strips of the top electrode to form a plurality of alternating rods and trenches; and releasing the bottom electrode, the piezoelectric material and the top electrode from the substrate.

17. The method of any of 15 and 16, wherein the bottom electrode is formed from aluminum, platinum, ruthenium, molybdenum, tungsten, or gold, or combinations thereof.

18. The method of any of 15-17, wherein the top electrode is formed from aluminum, platinum, ruthenium, molybdenum, tungsten, or gold, or combinations thereof.

19. The method of any of 15-18, wherein the piezoelectric material is formed from aluminum nitride, lead zirconate titanate, lithium niobate, lithium tantalite, zinc oxide, gallium nitride, scandium nitride, aluminum scandium nitride, or quartz, or combinations thereof.

20. The method of any of 15-19, further comprising forming one or more vias in the piezoelectric layer to the bottom electrode, and depositing a metal material in the one or more vias and on device pads.

DETAILED DESCRIPTION

Figure 1A:
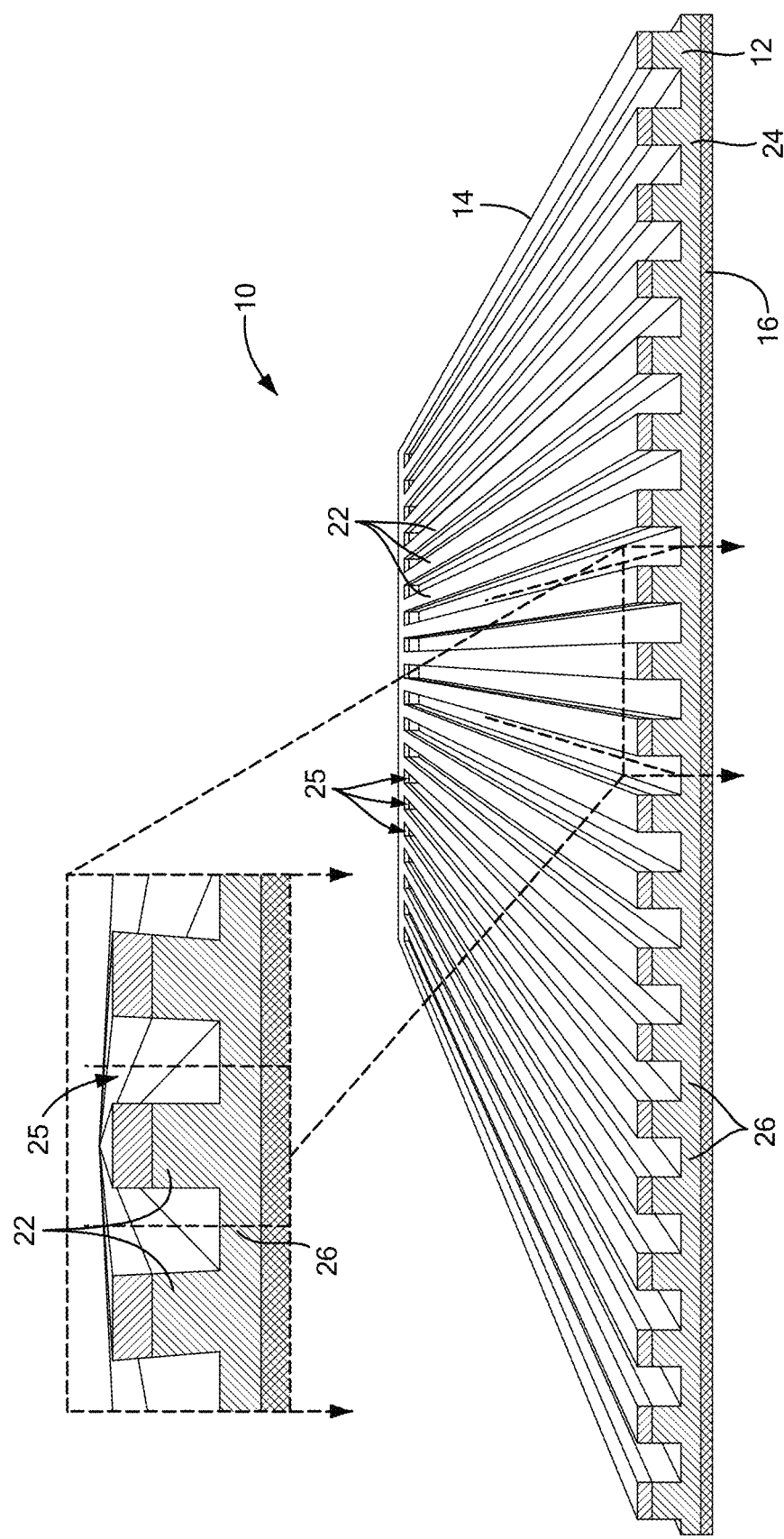
FIG. 1A is a schematic view of a 2.3 GHz two-dimensional rod resonator (2DRR) according to the technology described herein.

A class of AlN resonators is described that can provide acoustic resonant components that simultaneously exhibit high $k_t^2$ and a lithographic frequency tunability. These radio-frequency devices, labelled as two-dimensional-resonant-rods (2DRRs), exploit the unconventional acoustic behavior exhibited by a forest of locally resonant rods, built in the body of a profiled AlN layer that is sandwiched between a bottom un-patterned metal plate and a top metallic grating. 2DRRs exhibit unexplored modal features that make them able to achieve high-$k_t^2$, a significant lithographic frequency tunability and a relaxed lithographic resolution, while relying on an optimal AlN crystalline orientation. The operation of 2DRRs is discussed with use of analytical and finite-element (FE) investigations. The measured performance of a fabricated 2DRR, showing a $k_t^2$ in excess of 7.4%, is also reported.

By way of further explanation, in the last decades, bulk-acoustic-wave (BAW) filters have become essential components of 1G-to-4G radios. These devices rely on the high electromechanical coupling coefficient ($k_t^2 \sim 7\%$), attained by aluminum nitride (AlN) film-bulk-acoustic-resonators (FBARs), to achieve a wideband and low-loss frequency response. As the resonance frequency of FBARs is set by their thickness, the integration of multiple FBARs, to form filters, can only be attained through the adoption of frequency tuning fabrication steps, such as mass loading or trimming. However, as the ability to reliably control these steps significantly decays for thinner FBARs, manufacturing FBAR-based filters that can address the needs of emerging IoT and 5G high-frequency applications is becoming more and more challenging.

More particularly, acoustic resonators and filters have represented key components for several radio-frequency (RF) applications and systems. For instance, their superior performance, when compared to conventional electromagnetic counterparts, has made them essential to form frequency selective passive components in miniaturized RF platforms. Aluminum nitride (AlN) film-bulk-acoustic-resonators (FBARs) have been extensively used to form filters in commercial RF front-ends. In fact, thanks to their ability to attain a large electromechanical coupling coefficient ($k_t^2 \sim 7\%$), while being manufacturable through conventional semiconductor fabrication processes, FBARs have enabled commercial ultra- and super-high-frequency (U/SHF) acoustic filters, exhibiting fractional bandwidths and performance exceeding those required by 4G communication systems.

However, despite their high-$k_t^2$, the resonance frequency ($f_{res}$) of FBARs is set by the thickness of the different forming layers. This feature renders the manufacture of FBARs, having different $f_{res}$-values, only attainable through post-processing steps, like trimming and mass loading, thus leading to a much higher fabrication complexity. Such complexity becomes even more significant when FBAR-based filters, operating at higher frequencies, are required to satisfy the needs of the emerging super- and extremely-high-frequency (S/EHF) IoT and 5G applications. In fact, in such case, FBARs with significantly thinner metallic and piezoelectric layers are required, to enable the desired higher frequency operation.

This constraint comes with an increased sensitivity of $f_{res}$ with respect to the thickness of the FBAR layers. This feature renders any step of mass-loading or trimming not easily controllable and, consequently, hardly usable in a large-scale production. Therefore, in recent years, many groups have researched AlN-based device technologies, simultaneously enabling high-$k_t^2$ and a lithographic frequency tunability. In particular, cross-sectional-Lamé-mode resonators (CLMRs) and two-dimensional-mode-resonators (2DMRs) were recently demonstrated. CLMRs excite a combination of vertical ($S_1$) and lateral ($S_0$) longitudinal motions, in AlN plates, through a coherent combination of the $d_{31}$ and $d_{33}$ piezoelectric coefficients. In contrast, 2DMRs excite a set of dispersive $S_1$-Lamb wave modes, confined between the strips forming their metallic gratings. While CLMRs enable a comparable $k_t^2$-value attained by FBARs and a significant lithographic frequency tunability ($\Delta f$), conventional 2DMRs can generally achieve a slightly lower $k_t^2$ (<5%) and a reduced $\Delta f$-value. However, these devices can excite resonant vibrations through metallic gratings that are formed by wider metallic strips than those required by CLMR, operating at the same frequency. For this reason, they enable significantly lower ohmic losses than CLMRs, hence higher Q, thus being promising candidates to achieve monolithic integrated acoustic filters, for 5G communication systems. Only recently, modified 2DMRs, using a set of top and bottom metallic frames, were proposed to enable comparable $k_t^2$ and $\Delta f$-values attained by CLMRs, while still ensuring a more relaxed lithographic resolution. However, the adoption of these frames leads to a heavily enhanced fabrication complexity, with respect to conventional 2DMRs and CLMRs.

The operational features relative to a set of rod-modes, labeled here as dilatational modes, have been investigated through numerical methods. These modes can exhibit superior $k_t^2$ (~10%, in AlN) and $\Delta f$-values. However, up to date, it has been believed that such a high-$k_t^2$ is only attainable in one isolated and narrow rod. Consequently, the use of dilatational modes has been considered not suitable for practical filtering applications, where devices with large input capacitances ($C_0$) are required to ensure proper functioning with 50Ω-matched electronics. There has been no proposition of any multi-finger acoustic resonator design capable of efficiently and coherently exciting such modes, in single piezoelectric slabs.

To address these challenges, an RF acoustic resonant technology is provided that enables the production on integrated silicon chips of low-loss and wideband miniaturized filters for communication systems (cellphones or other wireless devices). Devices as described herein can also be used to attain sensors within the Internet-of-Things (IoT). Differently from previously developed technologies, devices described herein can use the acoustic properties of profiled piezoelectric layers to achieve much better performance, in terms of electromechanical coupling coefficient, than attained by other devices that use plate. For this reason, these devices can reach performance levels that are greatly enhanced with respect to the existing counterparts that are used nowadays in modern integrated radio-frequency front-ends.

Figure 1B:
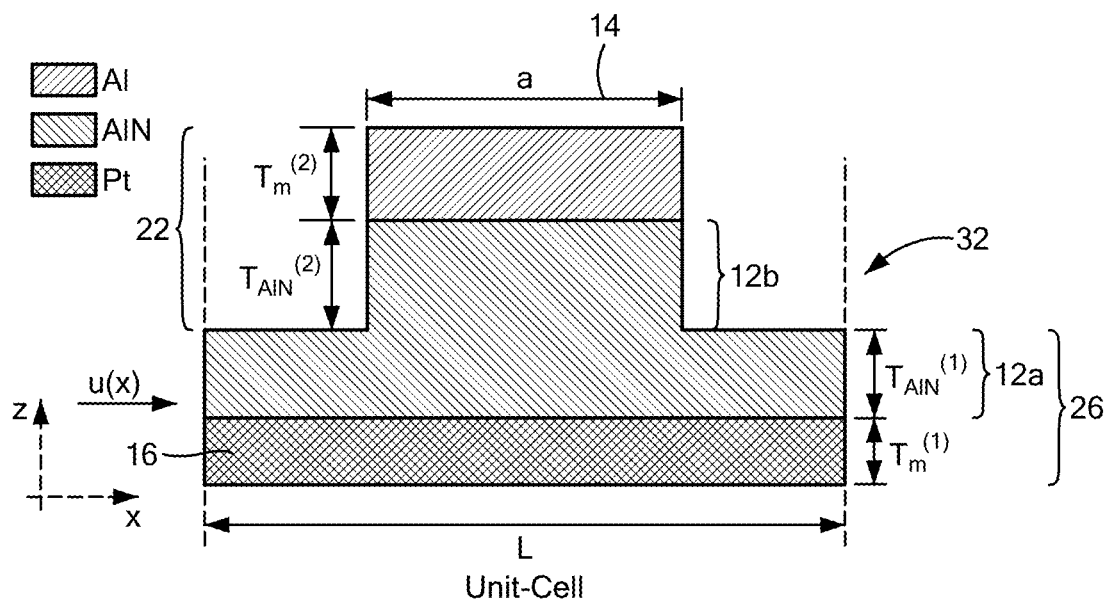
FIG. 1B illustrates a cross-sectional view of a periodic unit-cell forming a device according to the technology herein and a description of materials adopted in one 2DRR implementation ($T_{AlN}^{(1)}$=400 nm, $T_{AlN}^{(2)}$=600 nm, $T_m^{(1)}$=250 nm and $T_m^{(2)}$=330 nm).
Figure 1C:
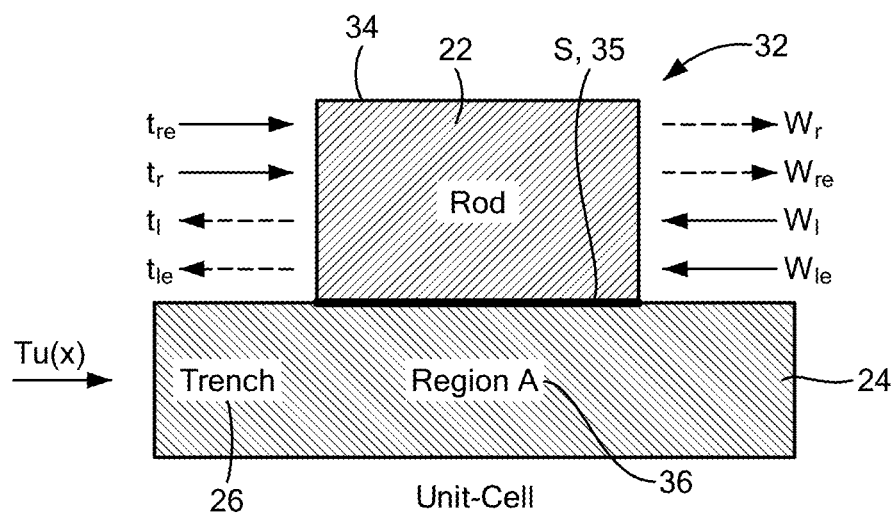
FIG. 1C illustrates adopted nomenclature for the three main regions forming the 2DRR unit-cell and schematic representation of the different displacement components defined in Eqs. (2-3).
Figure 2:
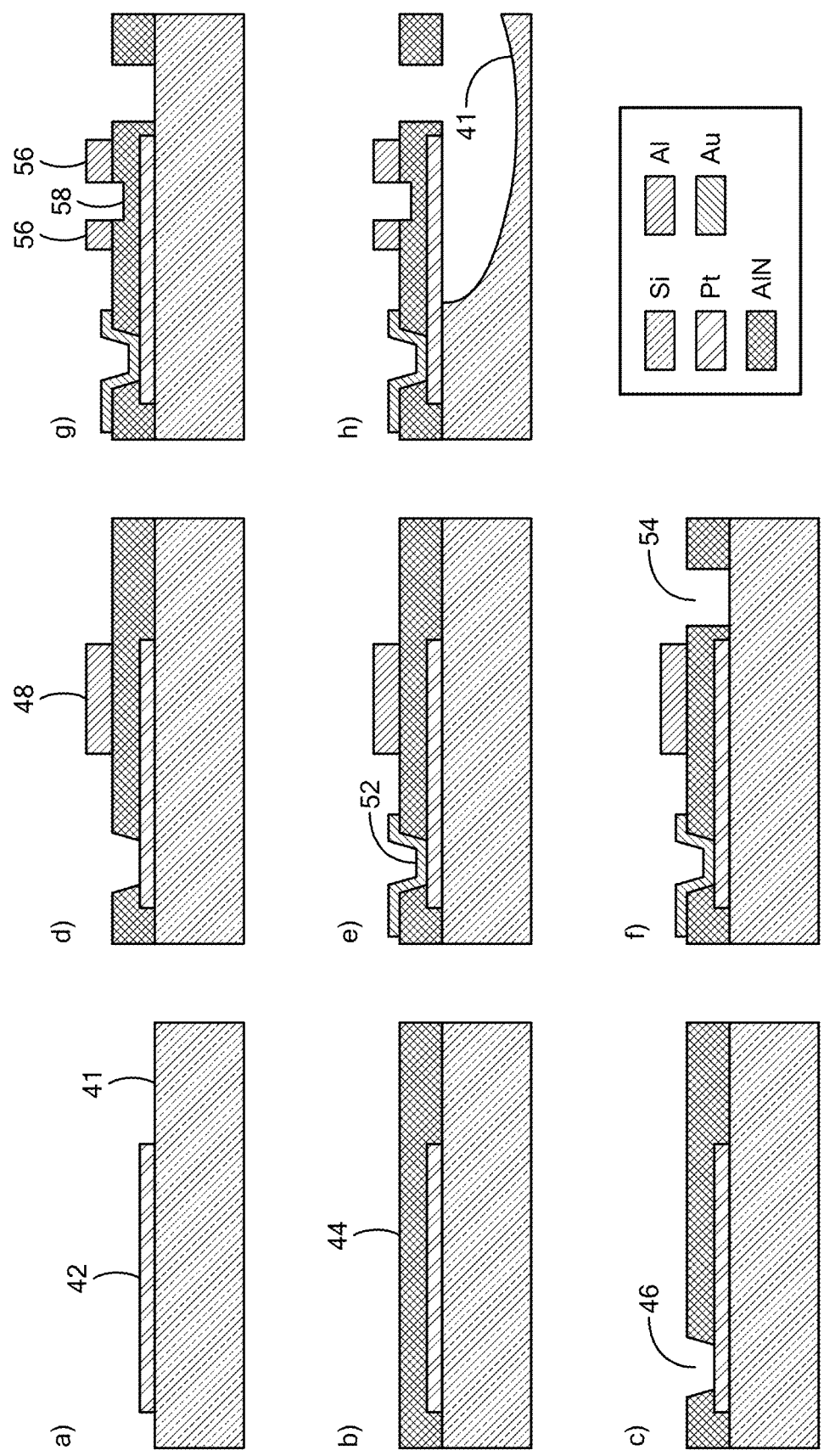
FIG. 2 illustrates a schematic view of the fabrication flow used to build a 2DRR as described herein. In the example illustrates, the process starts with the sputtering deposition of a 250-nm-thick Pt full-plate used as bottom electrode (a) followed by a 1-µm-thick AlN-film deposition (b). Vias are then formed, in the AlN-layer, through a wet-etch process (c) followed by the sputtering and lift-off of a 330 nm-thick Al-layer forming the top metal layer (d). Then, a 150-nm-thick Au-layer is deposited, on the device pads and in the vias (e), so as to minimize their associated ohmic losses. Later, the releasing holes are formed through an AlN dry-etch (f) followed by the patterning of the top electrodes and the derivation of the AlN trenches (g). These two steps are attained through a combination of wet and dry-etch, which is optimized so as to minimize the surface roughness and optimize the AlN sidewall angle in the trenches. Finally, the devices are released through a XeF$_2$ silicon etching process (h).
Figure 3:
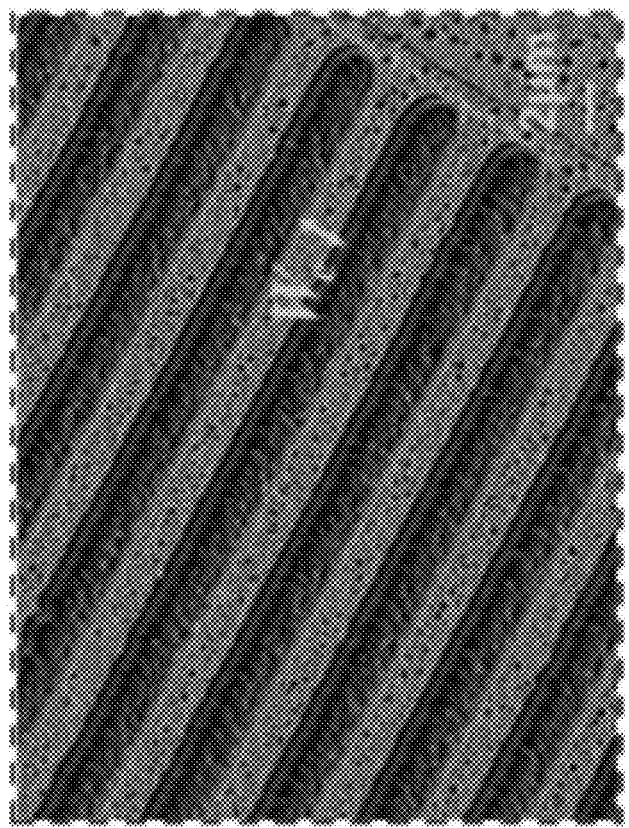
FIG. 3 illustrates scanned Electron Microscope (SEM) pictures of a fabricated 2DRR (Device A). The picture on the left shows the device top-view. A zoom-in picture of the part highlighted in dashed lines is shown on the right. This picture shows the device topology after the formation of rods and trenches.
Figure 3:
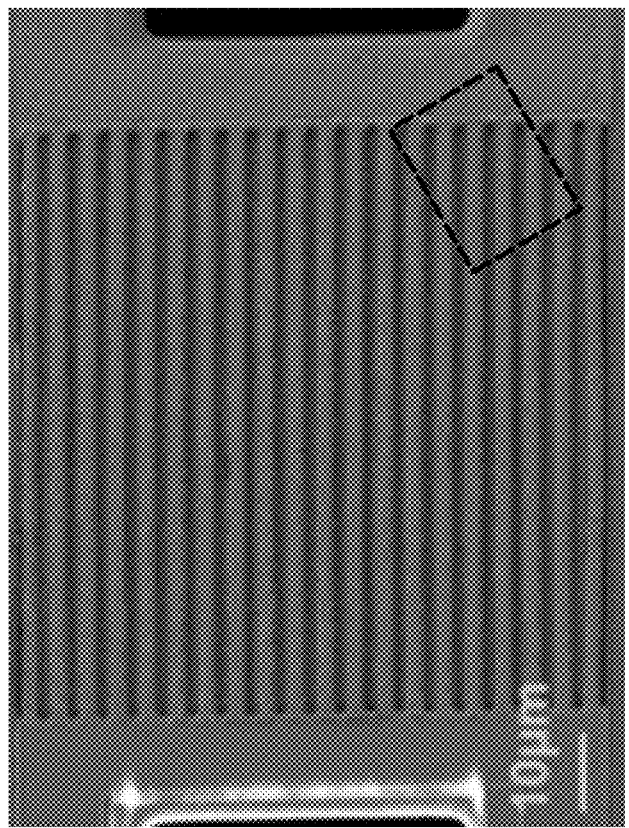

Referring to FIGS. 1A-1C, a device 10 labeled as two-dimensional resonant rods ("2DRRs") is formed by a profiled AlN-layer 12, sandwiched between one top metal grating 14 and a grounded bottom metal plate 16 (FIG. 1A). Such devices exploit the excitation of a combined set of dilatational modes, in a single AlN plate, To do so, 2DRRs rely on a forest of locally resonant piezoelectric rods 22, built on the top surface of a thin multi-layered beam 24. These rods are attained by partially etching the AlN-portions to form gaps 25 between adjacent metal strips forming the grating (FIGS. 2, 3). The etching profile or depth is engineered to form steep trenches 26 that exhibit an evanescent lateral wavevector component ($k_x$), at $f_{res}$. This feature permits the confinement of the resonant vibration within the rod, thus rendering adjacent rods only weakly and reactively coupled, so as to ensure a common frequency of operation. Moreover, because of their modal characteristics, 2DRRs exhibit a higher sensitivity of $f_{res}$ with respect to the rod width (a). Ultimately, the adoption of trenches allows suppression of any non-vertical electric field line that would otherwise be generated between adjacent strips forming the grating, which would lower the obtainable $k_t^2$. Meanwhile, by adopting un-patterned bottom metal plates instead of patterned ones, like those required by both CLMRs and 2DMRs to achieve high-$k_t^2$, 2DRRs can rely on AlN-films exhibiting an optimal crystalline orientation, even when thinner films are needed to operate in the 5G spectrum. The profiled AlN layers also render $f_{res}$ lithographically controllable through the rod-width (a, also termed $W_e$). Here, the performance of a fabricated 2.3 GHz 2DRR (FIG. 1A) is reported along with discussions about its operation, through both a simplified one-dimensional analytical model and through finite-element-methods (FEM).

Fabrication of the 2DRR (FIG. 1A) can follow the process flow shown in FIG. 2. In one example, it starts with the sputtering deposition of a 250-nm-thick platinum full-plate 42, used as bottom electrode (FIG. 2(a)), in a substrate 41. It follows with the sputtering deposition of a 1-μm-thick AlN-film 44 (FIG. 2(b)). Vias 46 are then formed, in the AlN-layer, through a wet-etch process (FIG. 2(c)), followed by the sputtering and lift-off of a 330 nm-thick aluminum layer 48, forming the top metal layer (FIG. 2(d)). Then, a 150-nm-thick gold layer 52 is deposited, on the device pads and in the vias (FIG. 2(e)), so as to minimize their associated ohmic losses. Later, the releasing holes 54 are formed through an AlN dry-etch (FIG. 2(f)), followed by the patterning of the top electrodes 56 and the derivation of the AlN trenches 58 (FIG. 2(g)). These two steps are attained through a combination of wet and dry-etch, which can be optimized so as to minimize the surface roughness and optimize the AlN sidewall angle in the trenches. Finally, the devices are released from the substrate 41 through a $XeF_2$ silicon etching process (FIG. 2(h)). Tolerances on the dimensions can be ±0.5%, ±1%, ±2%, or ±5%.

In embodiments of the 2DRR described herein, a thickness of each of the rod portions of the piezoelectric layer can be greater than a thickness of the piezoelectric layer of each of the trenches. A thickness of each of the rods can be greater than a thickness of each of the trenches. Each of the trenches can have a depth in the thickness direction selected to constrain acoustic energy within the rods. Each of the rods has a width that can be selected to provide a determined frequency. Each of the trenches has a width that can be selected to optimize the determined frequency of the rods. In some embodiments, the rods and the trenches each have an equal width within ±1%.

Figure 6:
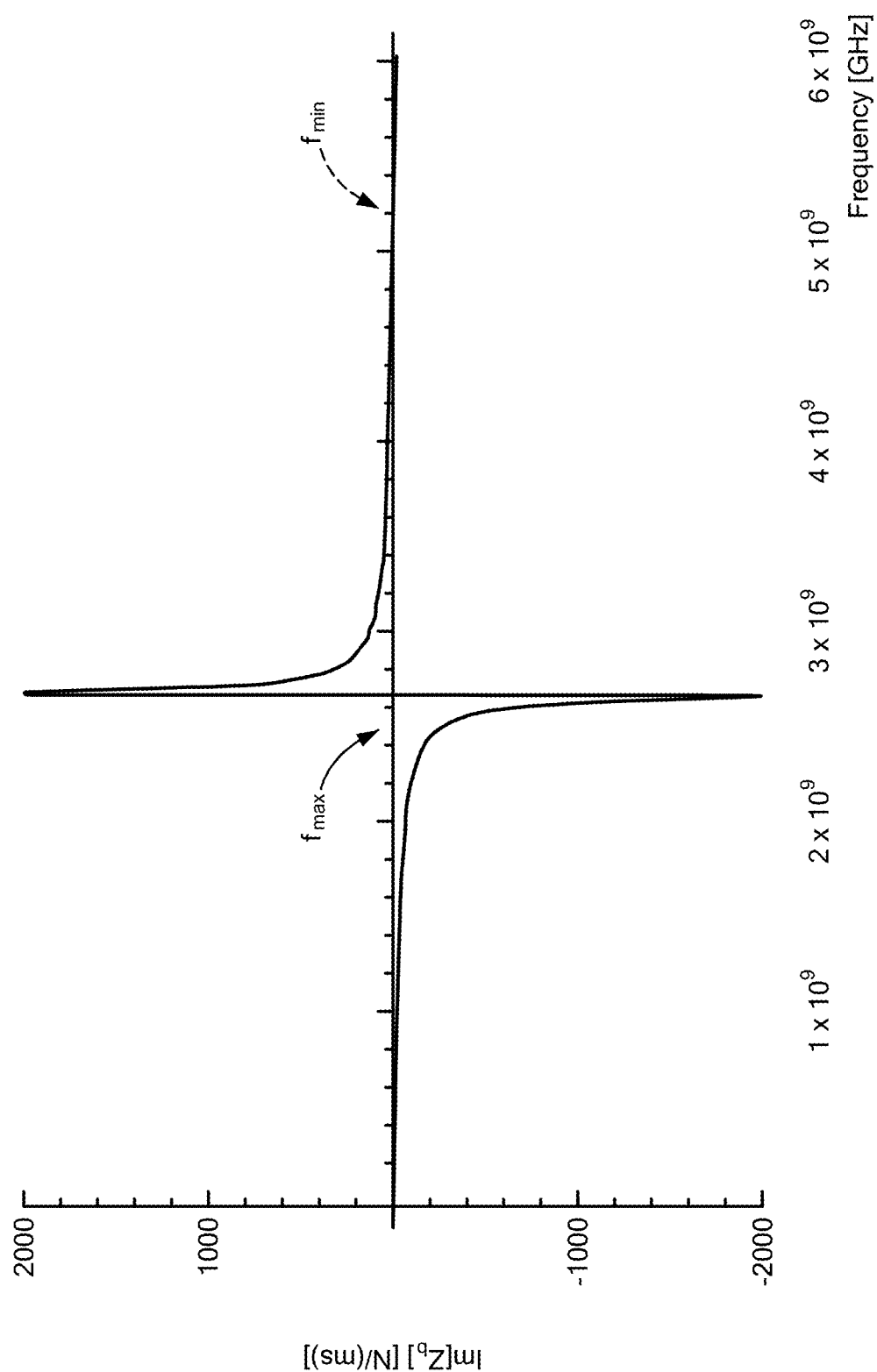
FIG. 6 illustrates analytically simulated distribution of the imaginary part of $Z_b$ as the frequency (f) is varied between 0 and 6 GHz.

To explain more particularly explain how multiple dilatational modes can be excited in the 2DRR, the acoustic propagation characteristics exhibited by one of its periodic cells, i.e., the unit-cell, 32 (see FIGS. 1B, 1C) can be studied. The unit-cell is formed by two main regions, here defined as trench 26 and rod 22. The trench is formed by the bottom metallic plate 16 and by a thin AlN layer 12a. The rod is formed by a thicker AlN-film 12b of portions of the AlN layer extending upwardly from the layer 12a, and by the second metallic layer 14. In the following, the thicknesses of the thin AlN-layer 12a, of the thicker AlN-layer 12b, of the bottom metal layer 16 and of the top-metal layer 14 are labeled as $T_{AlN}^{(1)}$, $T_{AlN}^{(2)}$, $T_m^{(1)}$ and $T_m^{(2)}$, respectively. Also, the length of the unit-cell 32 is labeled as L. The interface 35 between the rod and the portion of beam 24 underneath each rod is referred to as S, and Region A, 36, is the portion of the beam beneath S and the rod. The top face 34 of each rod 22 behaves as a stress-free (SF) boundary. Because of the distributed nature of the rod, this boundary translates into a different mechanical boundary condition (B.C) across S, at different frequencies. Such B.C can significantly perturb the vertical displacement in the rod, $u_z(z)$, generated by any force ($F(x,z=0)$) applied, to the rod, from Region A through S. In particular, when assuming that only a negligible dispersion affects thickness-extensional (TE) waves in the rod, $F(x,z=0)$ can be considered uniform across S, thus being simply indicated as F. The determination of F (Eq. (8)) allows the computation of the value of the driving impedance ($Z_b$) relative to the rod (see Eqs. (4-8)). $Z_b$ allows the establishment of the influence of the rod on the B.C exerted by Region A, across S. The distribution of $Z_b$ vs. f for the fabricated 2DRR, is plotted in FIG. 6. As the trench ($T_{AlN}^{(1)}+T_m^{(1)}$) is significantly thinner than the rod ($T_{AlN}^{(2)}+T_m^{(2)}$), it is reasonable to assume, in a first order of approximation, that only the flexural ($A_0$) and the lateral ($S_0$) plate modes can propagate within the trench. However, as the coupling between the rod and the trench can only occur through vertical fields and since a low dispersion affects the velocity of the $S_0$-mode, for the thickness over lambda ($\lambda$) ratio used for the trench, any coupling can be neglected, through the $S_0$, between the rod and the trench. This simplification allows to consider the $A_0$ as the only existing propagating mode that can guide acoustic energy between adjacent unit-cells of 2DRRs and permits the assumption of a uniform transversal displacement ($v(x)$), throughout the thickness of the trench. In this scenario, $v(x)$ can be estimated by solving a one-dimensional (1D) Euler-Bernoulli equation of motion (Eq. (1)), after selecting a proper set of B.Cs.

$$E_t I_t \frac{d^4 v(x)}{dx^4} - \rho_t A_t \omega^2 v(x) = -F\left(H\left(x-\frac{a}{2}\right) - H\left(x+\frac{a}{2}\right)\right) \quad (1)$$

In Eq. (1), $E_t$, $I_t$ and $A_t$ are, respectively, the effective Young's modulus (Eq. 10), second moment of inertia and cross-sectional area relative to the trench. The function H is the Heaviside function. From the homogenous of Eq. (1), it is straightforward to estimate the real dispersive wavevector (k, see Eq. (9)) associated to the $A_0$-mode, when excluding the presence of the rods. The distribution of $v(x)$ can be derived through the methodology introduced in Cassella et al. (C. Cassella and M. Rinaldi, 2018 *IEEE International Frequency Control Symposium (IFCS)* (2018), pp. 1-3). In particular, let $t(x)$ and $w(x)$ represent $v(x)$, for the left and right sides of Region A (see FIG. 1C). Both displacement distributions can be expressed as the superposition of left/right propagating and evanescent waves (Eqs. (2-3)). It is necessary to point out that the evanescent not propagating decaying terms can only be ignored from the solution of Eq. (1) when dealing with uniform plates, thus not including any rod.

$$t(x) = t_l(x)e^{ikx} + t_r(x)e^{ikx} + t_{re}(x)e^{-kx} + t_{le}(x)e^{kx} \quad (2)$$

$$w(x) = w_l(x)e^{-ikx} + w_r(x)e^{ikx} + w_{re}(x)e^{-kx} + w_{le}(x)e^{kx} \quad (3)$$

Figure 4:
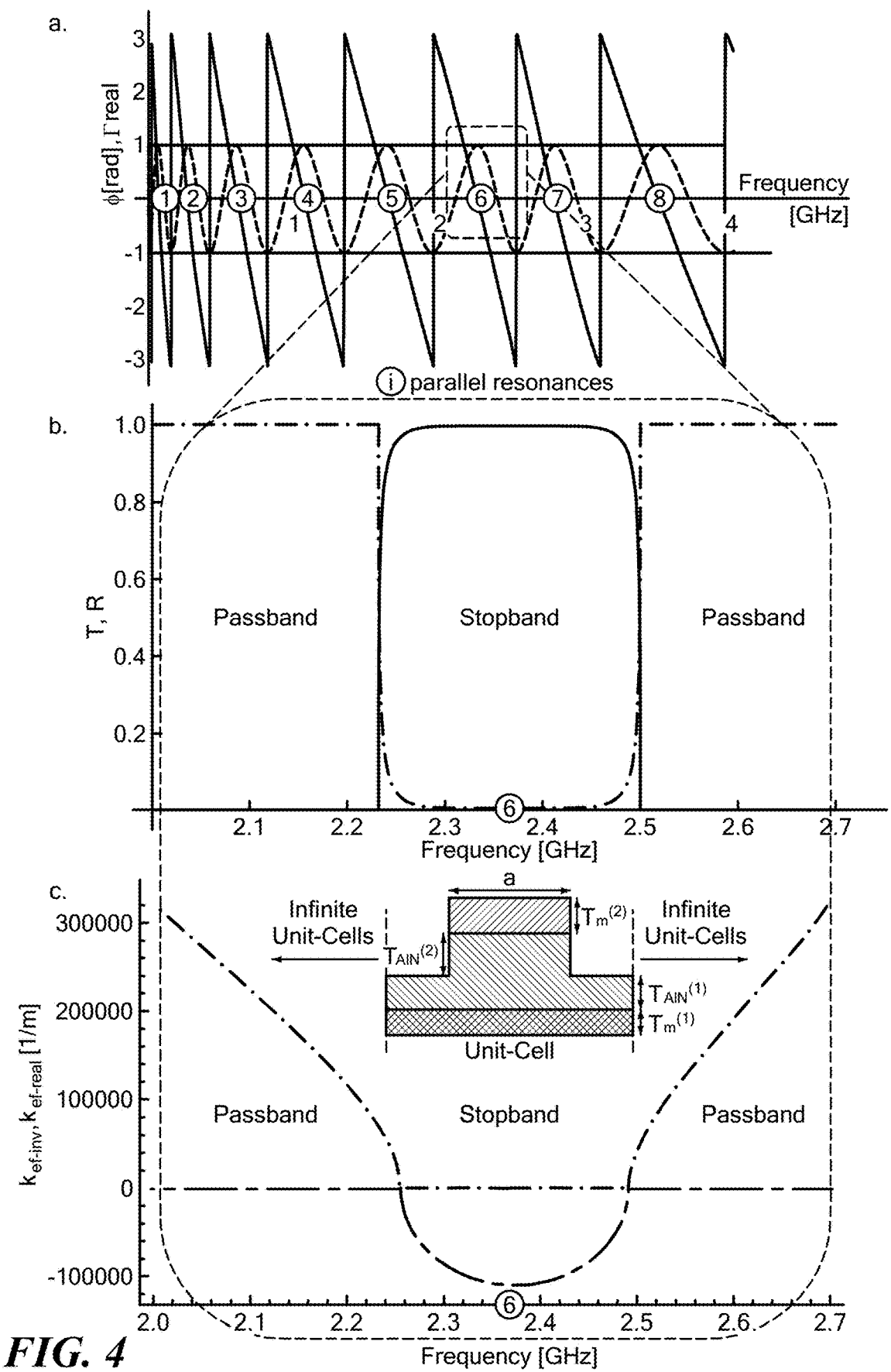
FIG. 4 illustrates: a) Simulated trends of φ and $\Gamma_{real}$ vs. f and relative to the unit-cell of the fabricated 2DRR; b) analytically derived trends of T (in blue) and R (i.e. 1–|T|, in red) vs. f relative to the fabricated 2DRR (FIG. 1A) and for f varying around the measured $f_{res}$; c) Analytically derived $k_{ef\text{-}real}$ (in blue) and $k_{ef\text{-}im}$ (in brown), when assuming the same geometrical and material characteristics adopted in the fabricated device.
Figure 7:
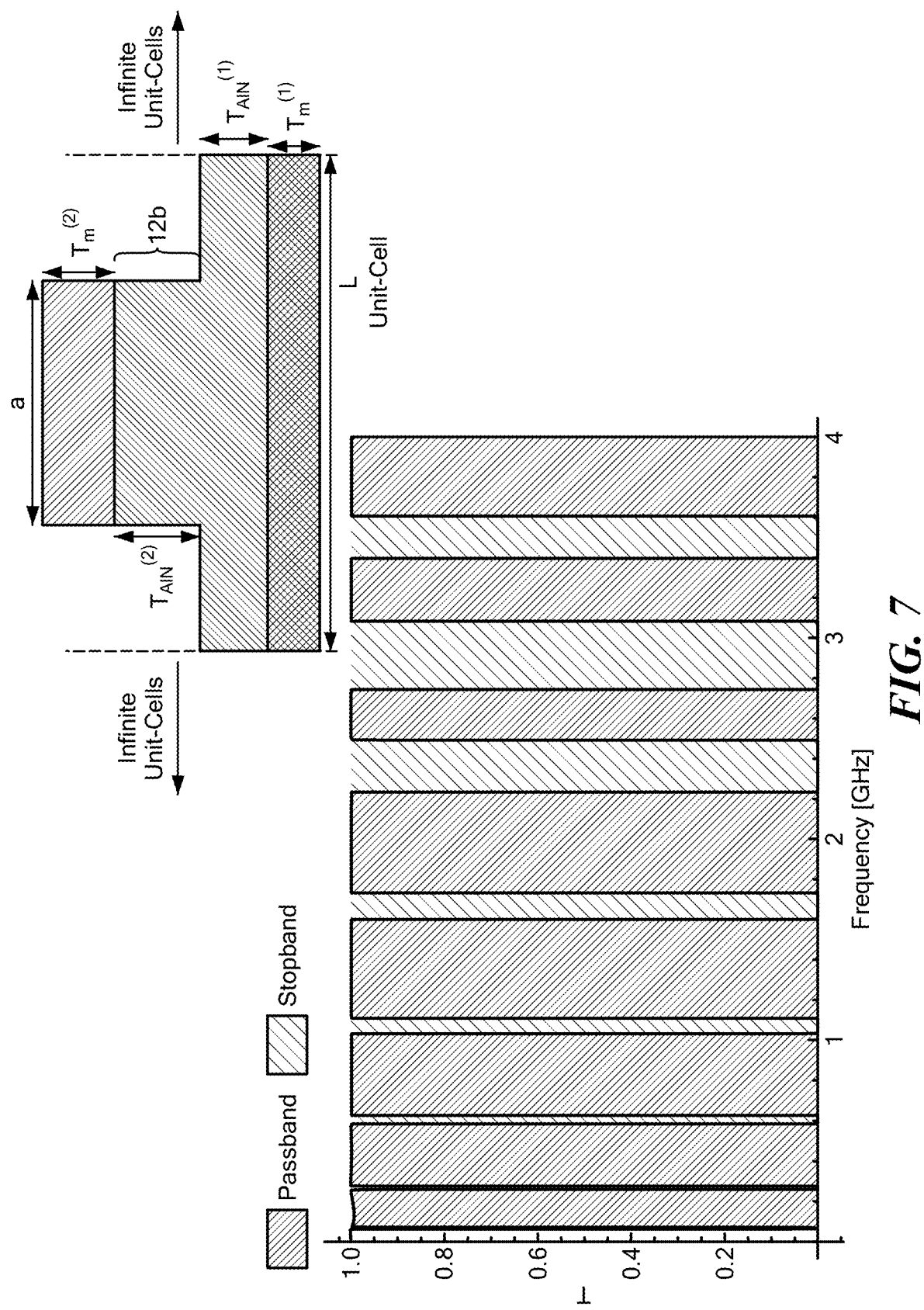
FIG. 7 illustrates simulated trend of T vs. f when assuming the same material and geometrical parameters used for considered unit-cell (see FIGS. 1B, 1C) and when considering each edge connected to an infinite sequence of unit cells.

In Eqs. (2-3), the subscript l and r indicate the moving directions of the different components (from left-to-right and from right-to-left, respectively). The subscript e refers to the evanescent wave components. Investigating the wave transmission through the unit-cell requires the computation of a transmission-matrix, $[T]_{4\times4}$ (see Eq. (26)), relative to the displacement field moving from one edge of the unit-cell towards the other. $[T]_{4\times4}$ maps the relationship between the amplitudes of the different components forming Eqs. (2-3), after considering the transformation that such components undergo, when moving through the trench portions adjacent to Region A. From $[T]_{4\times4}$, it is easy to determine the transmission coefficient, T, for the propagating displacement component of $v(x)$, leaving one edge of the unit-cell towards an infinite number ($N \rightarrow \infty$) of cascaded identical unit-cells. In particular, T is expected to be unitary at frequencies at which the rod does not affect the propagating features of the unit-cell. In contrast, T is expected to approach zero at the frequencies ($f^{(n)}$) at which the rod exhibits the largest influence. This important feature is determined by a process of acoustic energy storage in the rods and in Regions A. This reactive phenomenon prevents the flow of real power from adjacent unit-cells. The extrapolation of T allows to identify the existence of passbands and stopbands for the propagation of the $A_0$-mode in 2DRRs. It is worth emphasizing that the adoption of an infinite sequence of periodic cells, during the evaluation of T, permits to neglect the edge effect that, for a finite N-value, can partially alter the validity of the analytical treatment. The expression of T is rather cumbersome and its frequency distribution can only be determined numerically. As an example, a widespan representation of T vs. f, relative to the fabricated 2DRR, is plotted in FIG. 7. As evident, multiple stopbands exist for the $A_0$ propagation in the analyzed structure. In favor of a clearer visualization, the same T distribution, along with the corresponding attenuation coefficient ($R=1-|T|$), is plotted in FIG. 4(b), for close frequencies to the experimentally measured $f_{res}$ (~2.35 GHz). In order to fully understand the origin of the stopbands, both the phase ($\varphi$) and the real part ($\Gamma_{real}$) of the reflection coefficient ($\Gamma$) relative to the propagating displacement components, at the right edge of the unit-cell, can be looked at. The distributions of $\varphi$ and $\Gamma_{real}$ vs. f are reported in FIG. 4(a). As evident, $\Gamma$ exhibits a sequence of resonance conditions corresponding to the f-values at which $\varphi$ is equal to $\pm\pi$. Some of them (the series resonances) correspond to $\Gamma_{real}$-values equal to $-1$ (i.e. the expected value for stress-free boundaries) whereas the remaining ones (the parallel resonances) correspond to $\Gamma_{real}$-values equal to 1 (i.e. the expected value for fixed boundaries). These latter resonances identify the frequencies at which the rod is expected to exhibit the largest influence on the propagation characteristics of the unit-cell. The existence of multiple un-correlated frequencies at which such strong interaction exists is caused by the dispersive characteristics of the $A_0$-mode. Therefore, within the stopbands, the $A_0$-mode exhibits a large and evanescent wavevector ($k_{ef}=N \cdot k_{ef}^{(i)}$, being $k_{ef}^{(i)}$ the wavevector relative to one arbitrary unit-cell) that prevents the exchange of acoustic energy between adjacent unit-cells. In order to demonstrate the evanescent behavior of $k_{ef}$, FIG. 4(c) reports the numerically found real ($k_{ef\text{-}real}$) and imaginary ($k_{ef\text{-}im}$) parts of $k_{ef}^{(i)}$, for the analyzed and built 2DRR. Evidently, within the stopband, $k_{ef}^{(i)}$ is purely imaginary, which is a direct proof that no propagation of the $A_0$ occurs within this frequency range.

Figure 5A:
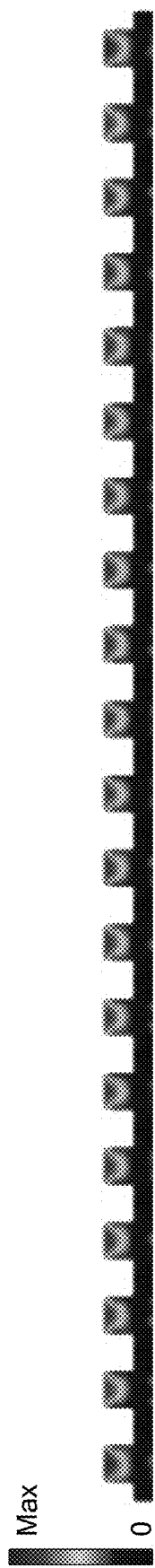
FIG. 5A illustrates FEM simulated resonant total displacement modal distribution, relative to the fabricated 2DRR (FIG. 1A).
Figure 5B:
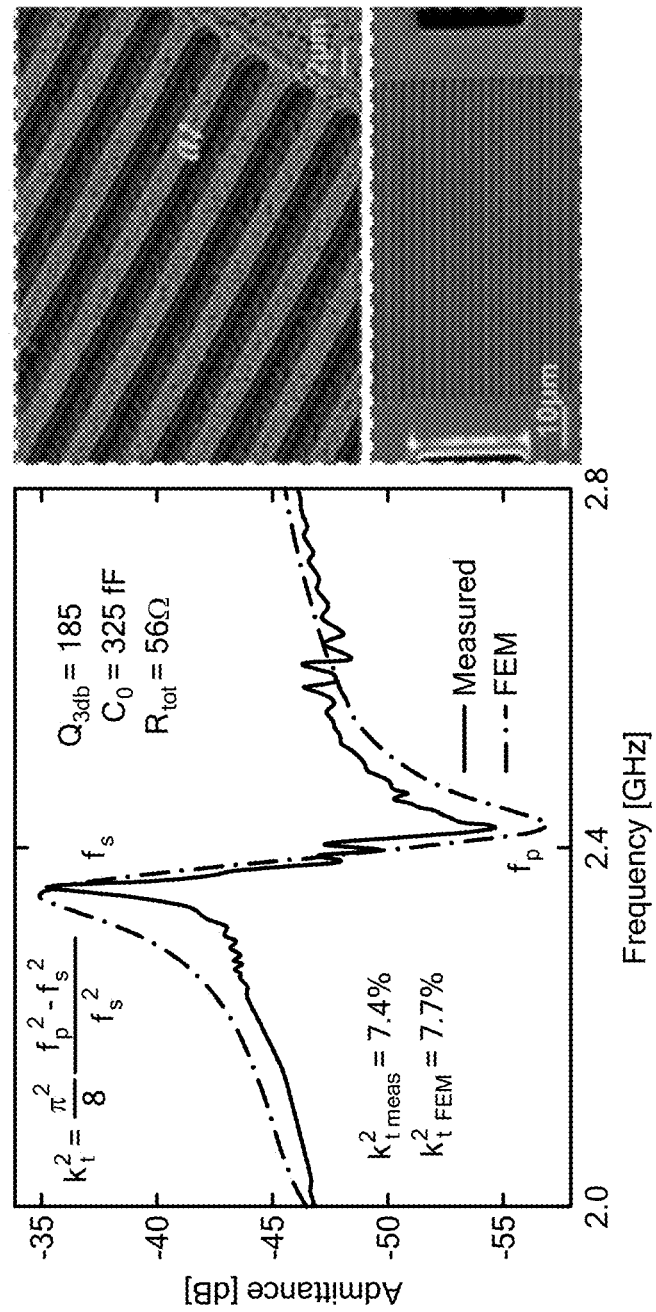
FIG. 5B illustrates measured (solid line) and simulated (dashed line) admittance for the fabricated device (FIG. 1A). As evident, with the exception of few addition spurious resonances in the measured results, there is a close matching between measured and FEM simulated results. Scanned Electron Microscope (SEM) pictures of the fabricated device are also shown.

Despite the fact that one side of an arbitrary unit-cell was used as the reference location ($x_0$) for the computation of T, the magnitude of T is invariant to $x_0$. So, the same T-values would be attained if a different reference location, included in the Region A, were used. This consideration helps to understand the origin of the unique modal features that characterize the operation of 2DRRs (see the FEM simulated displacement modeshape in FIG. 5A. In fact, the resonant vibration of these devices is piezoelectrically generated, in the rods and in Regions A, from the vertical electric field ($E_z$) that exists between the top metal strip and the bottom metal plate. In particular, $E_z$ couples to mechanical strain through the AlN $d_{31}$ and $d_{33}$ piezoelectric coefficients. However, because of the described dispersive properties of the unit-cell, the lateral edges of Regions A, from which the acoustic energy would tend to leak towards adjacent unit-cells, behave as fixed-boundaries. Consequently, the generated acoustic energy comes to be stored in the rod structures, whose lateral sides act as SF boundaries, hence being more prone to deform. As experimentally demonstrated (discussed below), this operational feature allows the generation of more mechanical energy than possible when no trench is used, thus being ultimately the main feature responsible for the high-$k_t^2$ attained by 2DRRs.

Figure 5C:
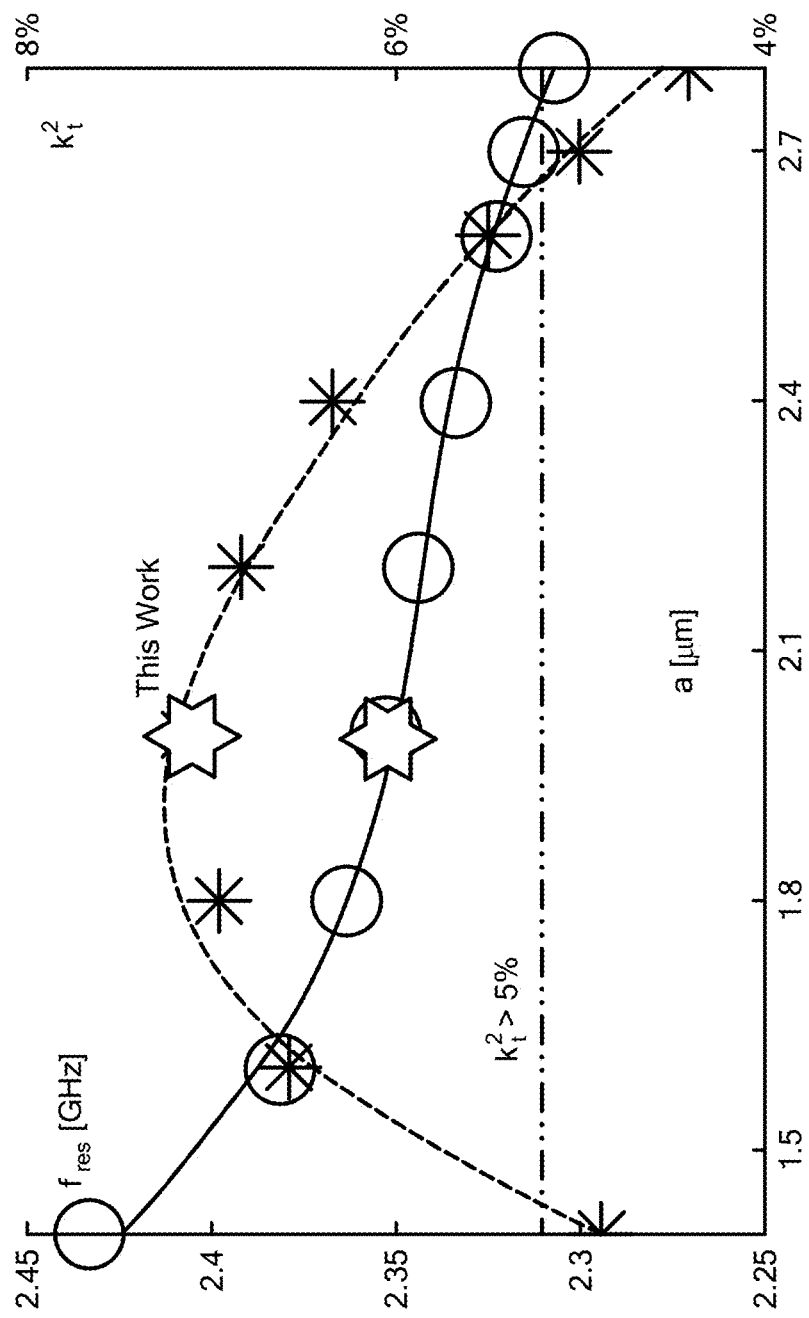
FIG. 5C illustrates FEM simulated distributions of $f_{res}$ and $k_t^2$ vs. a, when assuming the same material stack and geometrical parameters used for the fabricated 2DRR device (FIG. 1).

The electrical performance of the fabricated 2DRR (details on the fabrication flow described above) were extracted through conventional RF characterization tools. This device, which is formed by 20 unit-cells, shows measured $k_t^2$, resistance at resonance ($R_{tot}=R_m+R_s$), loaded quality factor $Q_{3dB}$ (extracted from the 3 dB bandwidth) and $C_0$ in excess of 7.4%, 56Ω, 185 and 325 fF (corresponding to an impedance of 208Ω), respectively. The measured $k_t^2$ and $C_0$ values match closely their FEM predicted values (7.7% and 300 fF, respectively). Ultimately, the capability to lithographically define the resonance frequency of 2DRRs was also investigated through FEM (FIG. 5C). This was done by simulating the trends of $k_t^2$ and $f_{res}$ vs. a, when considering the same material stack adopted for the reported 2DRR device. As evident, 2DRRs simultaneously enable a significant lithographic frequency tunability (Δf>117 MHz) and a large $k_t^2$ exceeding 5%. This feature renders them suitable components to form monolithic integrated wideband filters, for next-generation RF front-ends.

The devices can provide several advantages. Their operation relies on an acoustic technology that has not been exploited. The devices can excite acoustic waves in profiled aluminum nitride layers rather than in plates. This feature allows to overcome the technological limits that currently characterize the performance of existing radio-frequency aluminum nitride devices. This same technology can be applied to many other piezoelectric materials, such as PZT, $LiNbO_3$, aluminum thiocyanate (AlScN), and others. The devices not only allow the achievement of electromechanical coupling coefficients that can be higher than those attained by the commercialized ones, but also permit the building of multiple resonators on the same chip, thus creating an opportunity to build monolithic integrated filters, in commercial radio-frequency front-ends. The acoustic characteristics and operation of these devices show significant differences with respect to the other previously developed acoustic resonant technologies.

The devices described herein can achieve a higher electromechanical coupling coefficient ($k_t^2$) exceeding what is currently possible through the other available technologies. This feature permits the building of filters with wider fractional bandwidth and enables oscillators capable to dissipate a lower amount of energy to operate. The devices are lithographically defined aluminum nitride (AlN) acoustic technologies that have the ability to achieve high $k_t^2$ (>7%) while not requiring any patterned bottom-metal structure underneath the AlN-layer. For this reason, they do not suffer from any performance degradation that occurs, instead, in previously developed lithographically defined technologies and that are caused by the need of depositing the AlN-layer on top of a patterned metal structure. This feature solves a challenge that has prevented the use of lithographically defined AlN-acoustic resonators in the past. The devices use lithographic resolutions that can be more relaxed than required by previously developed AlN lithographically defined technologies. This feature enables their fabrication through standard lithographic methods, thus opening them to large-scale production.

The devices described herein have performance that make them useful to build low-loss and wideband RF filters for integrated wireless front-ends. Thus, they can be used to replace the currently used acoustic resonator technologies from next-generation radio-frequency front-ends. The devices have usefulness in the generation of low-power high-frequency oscillators for timing applications. Due to the superior electromechanical coupling ($k_t^2$), the devices can lead to a reduction in the amount of active gain that is required by active components in oscillators to sustain a low-noise oscillation. The technologies can have application as new sensors directly relying on the topology of the structure to reach higher sensitivity and lower power consumption. Because of their high coupling coefficient, the devices allow to build other RF passive components, such as hybrid couplers, piezoelectric transformers and others.

The devices can be used in applications related to the generation of low-power RF oscillators for timing applications. Oscillators are used by wireless systems to enable the required frequency conversion stages that permit to code or decode the information that must be transmitted or received, respectively. In addition, recent efforts have led to the first AlN-based voltage-controlled-oscillators in RF frequency synthesizers. These synthesizers are based on the use of film-bulk-acoustic-resonators, thus exhibiting a lower tuning sensitivity than possible through the adoption, in the same systems, of the devices described herein.

By enabling the fabrication of multiple resonators having different frequencies, through the same fabrication process, the design and fabrication complexity of needed RF filters can be simplified. This feature can lead to less expensive costs of production for such components.

The high electromechanical coupling coefficient that these device exhibit, together with their lithographic frequency tunability, render these devices useful as a passive technology for next-generation radio-frequency front-ends.

Analytical Study of the 2DRR Unit-Cell

In order to analyze the operation and unconventional dispersive characteristics of 2DRRs, it suffices to investigate the acoustic behavior relative to one of their periodic cell (i.e., the unit-cell, see FIGS. 1B, 1C). In fact, such cell captures all transitions between different acoustic characteristics that periodically occur across the entire device geometry. As discussed above, the unit-cell is formed by two main regions, defined as trench and rod, which are characterized, for the 2DRR fabricated according to this technology, by the mechanical and geometrical parameters shown in FIGS. 1B, 1C.

The faces of each rod that are orthogonal to their main vibrational direction (vertical z-direction) are characterized by different boundary conditions (B.Cs). The top face behaves as a stress-free boundary, whereas the bottom face is directly attached to the trench region labeled as Region A (see FIG. 1C). In particular, this latter face is loaded by the longitudinal force (F see Eq. (1) above) originated in Region A, oriented along the z-direction and perturbing the stress distribution and propagation features relative to the entire unit-cell. When assuming that only a negligible dispersion affects the velocity of longitudinal thickness-extensional (TE) waves in the rod, $u_z(z)$ can be estimated, in its frequency-domain representation, as (Eq. (4)):

$$u_z(z) = -\frac{F}{\omega \rho_{rod} A_{rod} c_{rod}} \left( \sin(k_{rod} z) + \frac{\cos(k_{rod} z)}{\tan(k_{rod}(T_{AlN}^{(2)} + T_m^{(2)}))} \right) \quad (4)$$

where F can be rewritten as $-E_{rod}A_{rod}\varepsilon_z(z=0)$, being $\varepsilon_z(z=0)$ the strain across S. In Eq. (1) $\rho_{rod}$, $A_{rod}$ and $c_{rod}$ represent the effective mass density, the cross-sectional area (i.e. $(T_{AlN}^{(2)}+T_m^{(2)})\cdot W$, being W the out-of-plane dimension relative to both the trenches and the rods) and the nondispersive phase velocity, for longitudinal waves, in the rods. In contrast, $k_{rod}$ and $\omega$ represent the wavevector relative to the same vertical motion and the natural frequency (i.e. $\omega=3\pi f$, being f the frequency), respectively. In order to estimate the mechanical properties and resonance frequency ($f_{res}$) of the TE-mode, in the rod, $\rho_{rod}$ and $c_{rod}$ can be found after computing effective values for the Young's modulus ($E_{rod}$) and mass density, based on the geometrical and mechanical parameters relative to the materials forming the rods. Therefore, $E_{rod}$ and $\rho_{rod}$ can be estimated as (Eqs. (5-8)):

$$E_{rod} = \frac{(E_{AlN}T_{AlN}^{(2)} + E_m^{(2)}T_m^{(2)})}{T_m^{(2)} + T_{AlN}^{(2)}} \tag{5}$$

$$\rho_{rod} = \frac{(\rho_{AlN}T_{AlN}^{(2)} + \rho_m^{(2)}T_m^{(2)})}{T_m^{(2)} + T_{AlN}^{(2)}} \tag{6}$$

From Eqs. (2-6), $c_{rod}$ can be found as:

$$c_{rod} = \sqrt{\frac{E_{rod}}{\rho_{rod}}} \tag{7}$$

The driving impedance across S ($Z_b$), relative to each rod, can be found through the Mason formalism (Eq. (8)).

$$Z_b = \frac{F}{vel(z=0)} = \frac{F}{-i\omega u_z(z=0)} = -i\rho_{rod}A_{rod}c_{rod}\tan(k_{rod}(T_{AlN}^{(2)} + T_m^{(2)})) \tag{8}$$

In Eq. (8), vel($z=0$) is the magnitude of the laterally uniform vertical velocity (i.e. time derivative of $u_z(z=0)$ with respect to time), at S. It is straightforward to notice (Eq. (6)) that $Z_b$ exhibits both a local maximum and a local minimum, at two correlated frequencies, $f_{min}$ and $f_{max}$, respectively. In particular, for f equal to $f_{min}$, $Z_b$ is equal to zero. Thus, at this frequency of operation, the rod does not exert any constraint on the displacement at S. For this reason, S acts, at $f_{min}$, as a conventional SF boundary, placed in the active resonator portion. In contrast, for f equal to $f_{max}$, the rod imposes a virtual fixed-constraint across S. It is worth mentioning that other non-conventional B.Cs characterize the impact of the rod on the behavior of S and, consequently, of Region A, for different frequencies from $f_{min}$ and $f_{max}$. Eq. (8) reports the distribution of $Z_b$, for the material and geometrical characteristics reported in FIG. 1 discussed above.

As discussed above, the propagation characteristics within the unit-cell can be found by solving the 1D Euler-Bernoulli equation (see Eq. (1) above), in terms of the transversal displacement in the trench (v(x)), after properly selecting a suitable set of B.Cs. However, from the solution of the homogenous of Eq. (1), it is useful to extract the wavevector (Eq. (9)) associated to the $A_0$-mode, when neglecting the presence of the rods.

$$k = \frac{\sqrt{2}\,3^{1/4}\sqrt{\omega}\,\rho_t^{1/4}}{\sqrt{T_m^{(1)} + T_{AlN}^{(1)}}\,E_t^{1/4}} \tag{9}$$

In Eq. (9), $E_t$ and $\rho_t$ are effective Young's modulus and mass density relative to the trench. In analogy to that done for the rods (Eqs. (5-6)), these parameters can be found, for the unit-cell of the fabricated 2DRR (FIGS. 1B, 1C), as (Eqs. (10-11)):

$$E_t = \frac{(E_{AlN}T_{AlN}^{(1)} + E_{Pt}T_m^{(1)})}{T_m^{(1)} + T_{AlN}^{(1)}} \tag{10}$$

$$\rho_t = \frac{(\rho_{AlN}T_{AlN}^{(1)} + \rho_{Pt}T_m^{(1)})}{T_m^{(1)} + T_{AlN}^{(1)}} \tag{11}$$

It can be pointed out that the magnitude of F, in Eq. (1) above, can be directly expressed in terms of the driving impedance of the rod ($Z_b$, see Eq. (8)). In fact, its value can be computed as $F=Z_b \cdot vel(z=0)$, thus being independent from x. The distribution of v(x) can be derived through the methodology discussed in Williams et al. 2015 (E. G. Williams, P. Roux, M. Rupin, and W. A. Kuperman, Phys. Rev. B 91, 104307 (2015)). In particular, after breaking v(x) into its portions (t(x) and w(x)), for the left and right sides of Region A (see Eqs. (2-3) above), a scattering matrix ($[G]_{4\times 4}$) can be defined. $[G]_{4\times 4}$ captures the changes of the wave characteristics (Eq. (12)) that occur at the transitions between each uncovered trench region and Region A (see FIGS. 1B, 1C). More specifically, $[G]_{4\times 4}$ allows to map the interaction between the wave components going towards the rods ($t_l$, $t_{le}$, $w_r$, $w_{re}$) and those ($t_r$, $t_{re}$, $w_l$ and $w_{le}$) that, instead, are reflected by them r, re, (Eq. (12)). For this reason, it is a function of the geometrical and material composition of the entire unit-cell. The matrix $[G]_{4\times 4}$ is reported in Eq. (13).

$$\begin{bmatrix} t_l \\ t_{le} \\ w_r \\ w_{re} \end{bmatrix} = [G]_{4\times 4} \begin{bmatrix} t_r \\ t_{re} \\ w_l \\ w_{le} \end{bmatrix} \tag{12}$$

$$[G]_{4\times 4} = \begin{bmatrix} r & r_{ef} & t & t_{ef} \\ r_{fe} & r_e & t_{fe} & t_e \\ t & t_{ef} & r & r_{ef} \\ t_{fe} & t_e & r_{fe} & r_e \end{bmatrix} \tag{13}$$

It can be pointed out that the two vectors shown in the left-($[v_1]_{4\times 4}$) and right-($[v_2]_{4\times 4}$) sides of Eq. (12) are composed by the amplitudes of the different wave components forming t(x) and w(x), at the lateral edges of Region A. Regarding $[G]_{4\times 4}$, r and t map the reflection and transmission coefficients for the different propagating wave components that are incident towards Region A. Clearly, due to the symmetric nature of this problem, r and t have the same value for both t(x) and w(x). Similarly, $r_e$ and $t_e$ represent the reflection and transmission coefficients relative to the evanescent terms of t(x) and w(x). Ultimately, $r_{ef}$, $t_{ef}$, $r_{fe}$ and $t_{fe}$ represent reflection and transmission coefficients capturing the phenomenon of energy-exchange between wave components having different propagation characteristics. Such wave-conversion phenomenon is originated from the different dispersive characteristics relative to distinct unit-cell regions (FIGS. 1B, 1C). In particular, $r_{ef}$ and $t_{ef}$ map the amplitude change relative to the reflected/transmitted flexural wave components, originated from the evanescent ones that are incident towards Region A. Similarly, $r_{fe}$ and $t_{fe}$ capture the amplitude change relative to the reflected/transmitted evanescent wave components, originated from the propagating ones that are incident towards Region A. The described transmission and reflection coefficients can be found by applying suitable boundary conditions (B.Cs) to Eq. (1). In particular, when assuming that the coupling of the rod with Region A can only occur through longitudinal vertical mechanical fields, the rod can only displace like a piston (pure TE). As a result, a uniform lateral displacement profile is expected in Region A. In such scenario, the B.Cs shown in Eq. (14) can be used to approximate the expected modal characteristics under the rod. In particular, the first three equations of Eq. (14) map the equality in the displacement, slope and curvature at the edges of Region A.

$$t\left(-\frac{a}{2}\right) = w\left(\frac{a}{2}\right) \tag{14}$$

$$t'\left(-\frac{a}{2}\right) = w'\left(\frac{a}{2}\right)$$

$$t''\left(-\frac{a}{2}\right) = w''\left(\frac{a}{2}\right)$$

$$w'''\left(-\frac{a}{2}\right) - t'''\left(\frac{a}{2}\right) = \frac{F}{E_t I_t} = \frac{Z_b v el(z=0)}{E_t I_t}$$

In contrast, the fourth equation captures the existence of a shear-force, at S, that counterbalances the laterally uniform force distribution at the bottom surface of the rod. After substituting Eqs. (2-3) (see above) in Eq. (14), the reflection and transmission coefficients, discussed above, can be found (see Eqs. (15-20)).

$$r = -\frac{(1-i)e^{-iak}F}{2F + (4+4i)E_t I_t k^3} \tag{15}$$

$$t = \frac{\left(\frac{1}{2} + \frac{i}{2}\right)e^{-iak}(F + 4E_t I_t k^3)}{F + (2+2i)E_t I_t k^3} \tag{16}$$

$$r_{ef} = t_{ef} = -\frac{(1-i)e^{\left(\frac{1}{2}-\frac{i}{2}\right)ak}F}{2F + (4+4i)E_t I_t k^3} \tag{17}$$

$$r_{fe} = t_{fe} = -\frac{(1+i)e^{\left(\frac{1}{2}-\frac{i}{2}\right)ak}F}{2F + (4+4i)E_t I_t k^3} \tag{18}$$

$$r_e = -\frac{(1+i)e^{ak}F}{2F + (4+4i)E_t I_t k^3} \tag{19}$$

$$t_e = \frac{\left(\frac{1}{2} - \frac{i}{2}\right)e^{ak}(F + 4iE_t I_t k^3)}{F + (2+2i)E_t I_t k^3} \tag{20}$$

It is worth pointing out that, when F is equal to zero, thus indicating that the rod does not affect the propagation of flexural waves in the unit-cell, $[G]_{4\times 4}$ becomes (Eq. (21)):

$$[G]_{4\times 4} = \begin{bmatrix} 0 & 0 & e^{-ika} & 0 \\ 0 & 0 & 0 & e^{ka} \\ e^{-ika} & 0 & 0 & 0 \\ 0 & e^{ka} & 0 & 0 \end{bmatrix} \tag{21}$$

Therefore, as expected, in such simplified scenario, all the reflection coefficients, as well as the transmission coefficients associated to the process of wave-conversion (i.e. $t_{ef}$ and $t_{fe}$), become zero. Therefore, only the transmission coefficient (t) is not nulled and equal to its expected value after assuming Region A to only act as an acoustic delay line that phase shifts or attenuates any existing propagating and evanescent component of t(x) and w(x), by an amount that is proportional to a. It is now useful to manipulate $[G]_{4\times 4}$ in such a way that the amplitudes of the wave components coming from the left-side of the rod (i.e. $[t]_{4\times 1}=[t_l, t_{le}, t_r, t_{re}]^T$) become the independent variables of Eq. (12), whereas those outgoing the right-side of the rod (i.e. $[w]_{4\times 1}=[w_l, w_{le}, w_r, w_{re}]^T$) act as the dependent ones. In such scenario, Eq. (12) becomes:

$$\begin{bmatrix} w_l \\ w_{le} \\ w_r \\ w_{re} \end{bmatrix} = [C]_{4\times 4} \begin{bmatrix} t_l \\ t_{le} \\ t_r \\ t_{re} \end{bmatrix} \tag{22}$$

In Eq. (22), the matrix $[C]_{4\times 4}$, known as the coupling matrix, captures the wave transmission characteristics (from the left-side to the right-side of the rod). The derived expression for $[C]_{4\times 4}$ is reported in Eq. (23).

$$[C]_{4\times 4} = \begin{bmatrix} -\frac{ie^{iak}(F+4ik^3)}{4k^3} & -\frac{ie^{\left(-\frac{1}{2}+\frac{i}{2}\right)ak}F}{4k^3} & -\frac{iF}{4k^3} & -\frac{ie^{\left(\frac{1}{2}+\frac{i}{2}\right)ak}F}{4k^3} \\ \frac{e^{\left(-\frac{1}{2}+\frac{i}{2}\right)ak}F}{4k^3} & \frac{e^{-ak}(F+4k^3)}{4k^3} & \frac{e^{\left(-\frac{1}{2}-\frac{i}{2}\right)ak}F}{4k^3} & \frac{F}{4k^3} \\ \frac{iF}{4k^3} & \frac{ie^{\left(-\frac{1}{2}-\frac{i}{2}\right)ak}F}{4k^3} & \frac{ie^{-iak}(F-4ik^3)}{4k^3} & \frac{ie^{\left(-\frac{1}{2}-\frac{i}{2}\right)ak}F}{4k^3} \\ -\frac{e^{\left(\frac{1}{2}+\frac{i}{2}\right)ak}F}{4k^3} & \frac{F}{4k^3} & \frac{e^{\left(\frac{1}{2}-\frac{i}{2}\right)ak}F}{4k^3} & \frac{e^{ak}(F-4k^3)}{4k^3} \end{bmatrix} \tag{23}$$

The derivation of $[C]_{4\times4}$ is key to find the transmission matrix, $[T]_{4\times4}$, relative to the entire unit-cell. However, in order to do so, it is necessary to apply an additional boundary condition that forces a periodic displacement distribution, with period equal to L, between adjacent periodic cells. This can be done by defining two new displacement vectors, $[t_-]_{4\times1}$ and $[w_+]_{4\times1}$, for $t(x=-L/2)$ and $w(x=L/2)$. In particular, when neglecting the existence of any loss mechanism, $[t_-]_{4\times1}$ and $[w_+]_{4\times1}$ are equal in magnitude and equivalent to modified versions of $[t]_{4\times4}$ and $[w]_{4\times4}$. Such modified versions are formed by phase-shifted or more attenuated copies of the propagating and evanescent components forming $[t]_{4\times1}$ and $[w]_{4\times1}$, respectively (see Eqs. (24-25)):

$$\begin{bmatrix} w_{l,+} \\ w_{le,+} \\ w_{r,+} \\ w_{re,+} \end{bmatrix} = [D]_{4\times4} \begin{bmatrix} w_l \\ w_{le} \\ w_r \\ w_{re} \end{bmatrix} = \begin{bmatrix} e^{-i\phi} & 0 & 0 & 0 \\ 0 & e^{\phi} & 0 & 0 \\ 0 & 0 & e^{i\phi} & 0 \\ 0 & 0 & 0 & e^{-\phi} \end{bmatrix} \begin{bmatrix} w_l \\ w_{le} \\ w_r \\ w_{re} \end{bmatrix} \quad (24)$$

$$\begin{bmatrix} t_{l,-} \\ t_{le,-} \\ t_{r,-} \\ t_{re,-} \end{bmatrix} = [D]_{4\times4}^{-1} \begin{bmatrix} t_l \\ t_{le} \\ t_r \\ t_{re} \end{bmatrix} = \begin{bmatrix} e^{-i\phi} & 0 & 0 & 0 \\ 0 & e^{\phi} & 0 & 0 \\ 0 & 0 & e^{i\phi} & 0 \\ 0 & 0 & 0 & e^{-\phi} \end{bmatrix}^{-1} \begin{bmatrix} t_l \\ t_{le} \\ t_r \\ t_{re} \end{bmatrix} \quad (25)$$

In Eqs. (24-25), $\phi$ is equivalent to $k \cdot (L+a)/2$. From Eqs. (24-25) it is possible to compute $[T]_{4\times4}$, relative to all the wave components travelling between adjacent edges of the unit-cell. This can be done by using Eq. (26).

$$[T]_{4\times4} = [D]_{4\times4} \cdot [C]_{4\times4} \cdot [D]_{4\times4} = \begin{bmatrix} \frac{e^{-ikL}(-iF+4k^3)}{4k^3} & -\frac{ie^{(\frac{1}{2}-\frac{i}{2})kL}F}{4k^3} & -\frac{iF}{4k^3} & \frac{ie^{(-\frac{1}{2}-\frac{i}{2})kL}F}{4k^3} \\ \frac{e^{(\frac{1}{2}-\frac{i}{2})kL}F}{4k^3} & \frac{1}{4}e^{kL}\left(4+\frac{F}{k^3}\right) & \frac{e^{(\frac{1}{2}+\frac{i}{2})kL}F}{4k^3} & \frac{F}{4k^3} \\ \frac{iF}{4k^3} & \frac{ie^{(\frac{1}{2}+\frac{i}{2})kL}F}{4k^3} & \frac{e^{ikL}(iF+4k^3)}{4k^3} & \frac{ie^{-ak-(\frac{1}{2}-\frac{i}{2})kL}F}{4k^3} \\ -\frac{e^{(-\frac{1}{2}-\frac{i}{2})kL}F}{4k^3} & -\frac{F}{4k^3} & -\frac{e^{(-\frac{1}{2}+\frac{i}{2})kL}F}{4k^3} & \frac{1}{4}e^{-kL}\left(4-\frac{F}{k^3}\right) \end{bmatrix} \quad (26)$$

As a sanity check, it is useful to look at the value of $[T]_{4\times4}$ when F is set to be zero, thus when the rod does not perturb the propagation characteristics of the unit-cell. As evident, in such scenario, the expression of $[T]_{4\times4}$ is heavily simplified (see Eq. (27)), thus clearly mapping the case in which the unit-cell can only phase-shift or attenuate existing propagating and evanescent wave components, in the trench.

$$[T]_{4\times4} = \begin{bmatrix} e^{-ikL} & 0 & 0 & 0 \\ 0 & e^{kL} & 0 & 0 \\ 0 & 0 & e^{ikL} & 0 \\ 0 & 0 & 0 & e^{-kL} \end{bmatrix} \quad (27)$$

It is important to point out that, as expected, different frequency behaviors characterize corresponding components of $[T]_{4\times4}$ and $[C]_{4\times4}$. Such a unique feature, which is mostly determined by the nonlinear dependence of k with respect to frequency (see Eq. (9)), determines the existence of multiple not correlated frequencies ($f^{(n)}$) at which the rod exerts the largest influence on the propagation capability of the trench. In particular, from the analysis of the eigenvalues of $[T]_{4\times4}$ (see Eq. (26)), it is possible to determine the transmission coefficient, T.

As discussed above, this coefficient captures the reduction of the magnitude of a propagating displacement component, referring to one edge of an arbitrary chosen unit-cell and outgoing the same cell towards an infinite number (N→∞) of cascaded and identical unit-cells. As an example, T is plotted, in FIG. 8, when assuming the same unit-cell geometry and material stack adopted in the fabricated 2DRR. As evident, multiple stopbands exist for the propagation of the $A_0$ in the analyzed structure. It is straightforward to notice that the center frequencies of such forbidden bands closely match the $f^{(n)}$ (from 1 to 8) values, identified in FIG. 4(a), above. This clearly proves that the largest influence of the rods, on the propagation characteristics of the unit-cell, occurs at those frequencies at which each rod produces virtual fixed-constraints across the lateral edges of the corresponding unit-cell.

Figure 8:
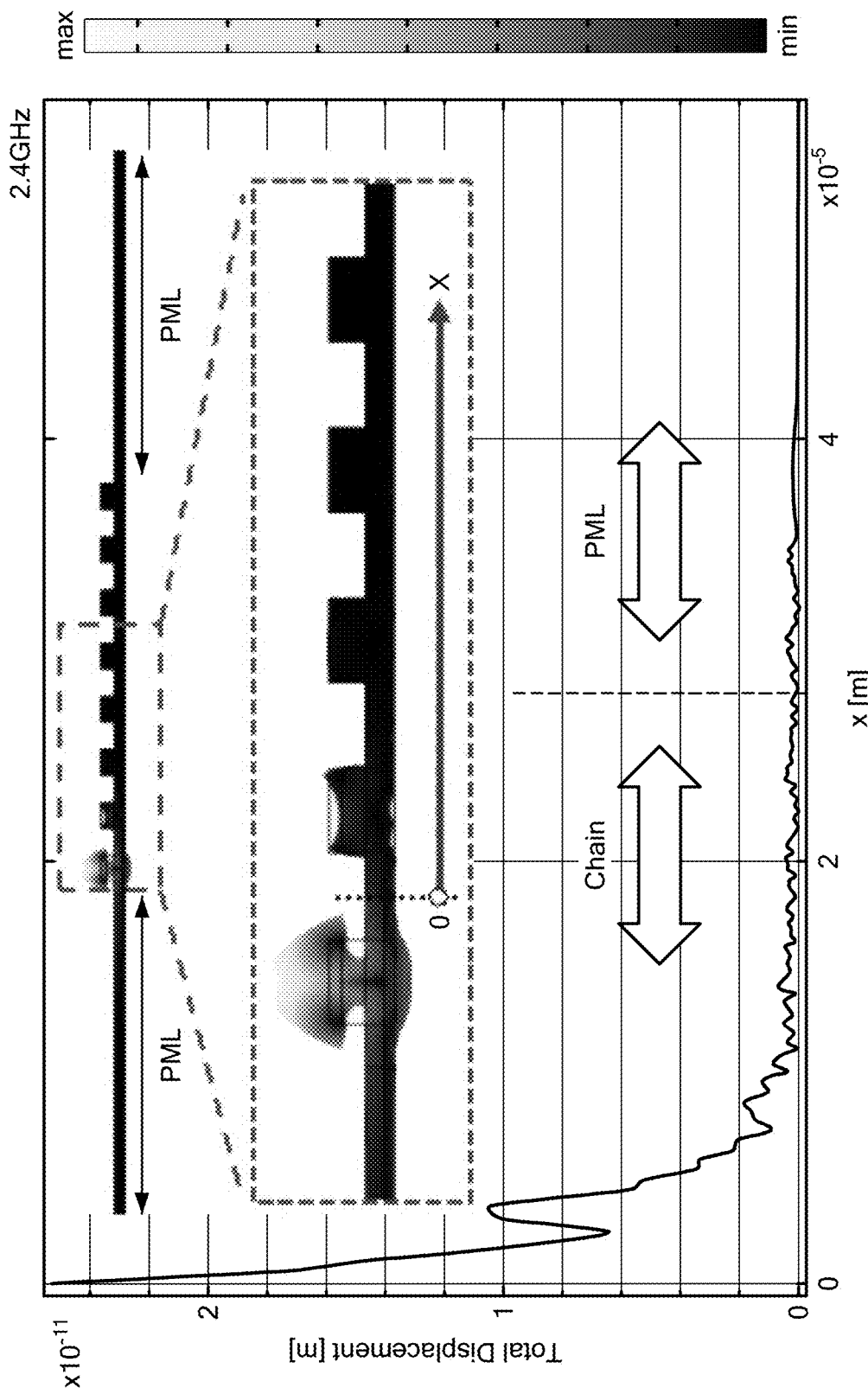
FIG. 8 illustrates FEM simulated modeshape of the total displacement in a chain of 7 unit-cells (FIGS. 1B, 1C) when driven, at 2.4 GHz, by one piezoelectric generator attached to it (here an electrically driven 2DRR unit-cell was used as the generator at 2.4 GHz). The spatial total-displacement distribution along a cut line, starting from the top-left edge of the closest unit-cell to the generator and ending at the top-right corner of the furthest PML, is also reported.
Figure 9:
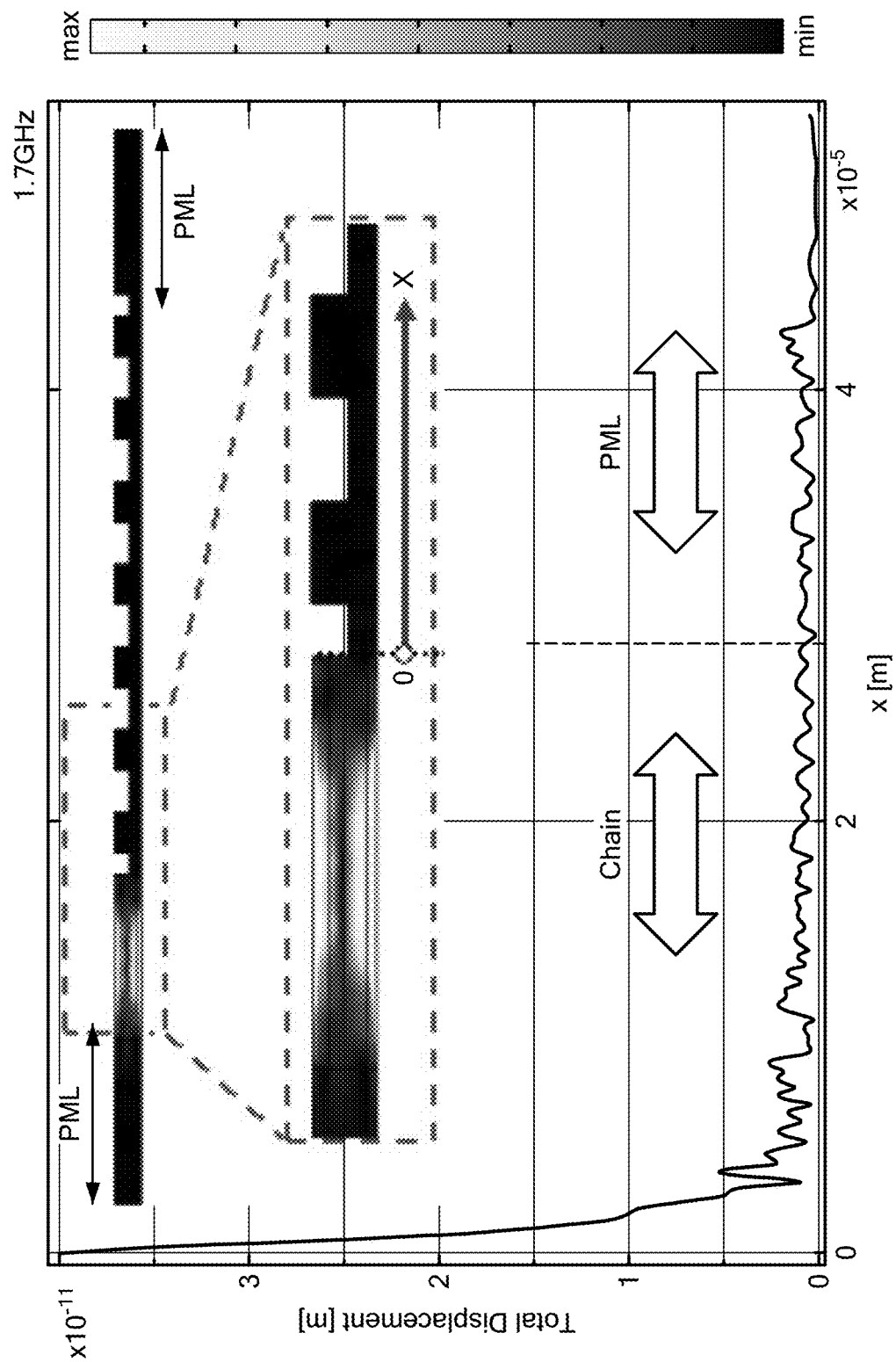
FIG. 9 illustrates FEM simulated modeshape of the total displacement in a chain of 7 unit-cells (FIGS. 1B, 1C), when driven, at 1.7 GHz, by one piezoelectric generator attached to it. The spatial total displacement distribution along a cut line, starting from the top-left edge of the closest unit-cell to the generator and ending at the top-right corner of the furthest PML, is also reported.
Figure 10:
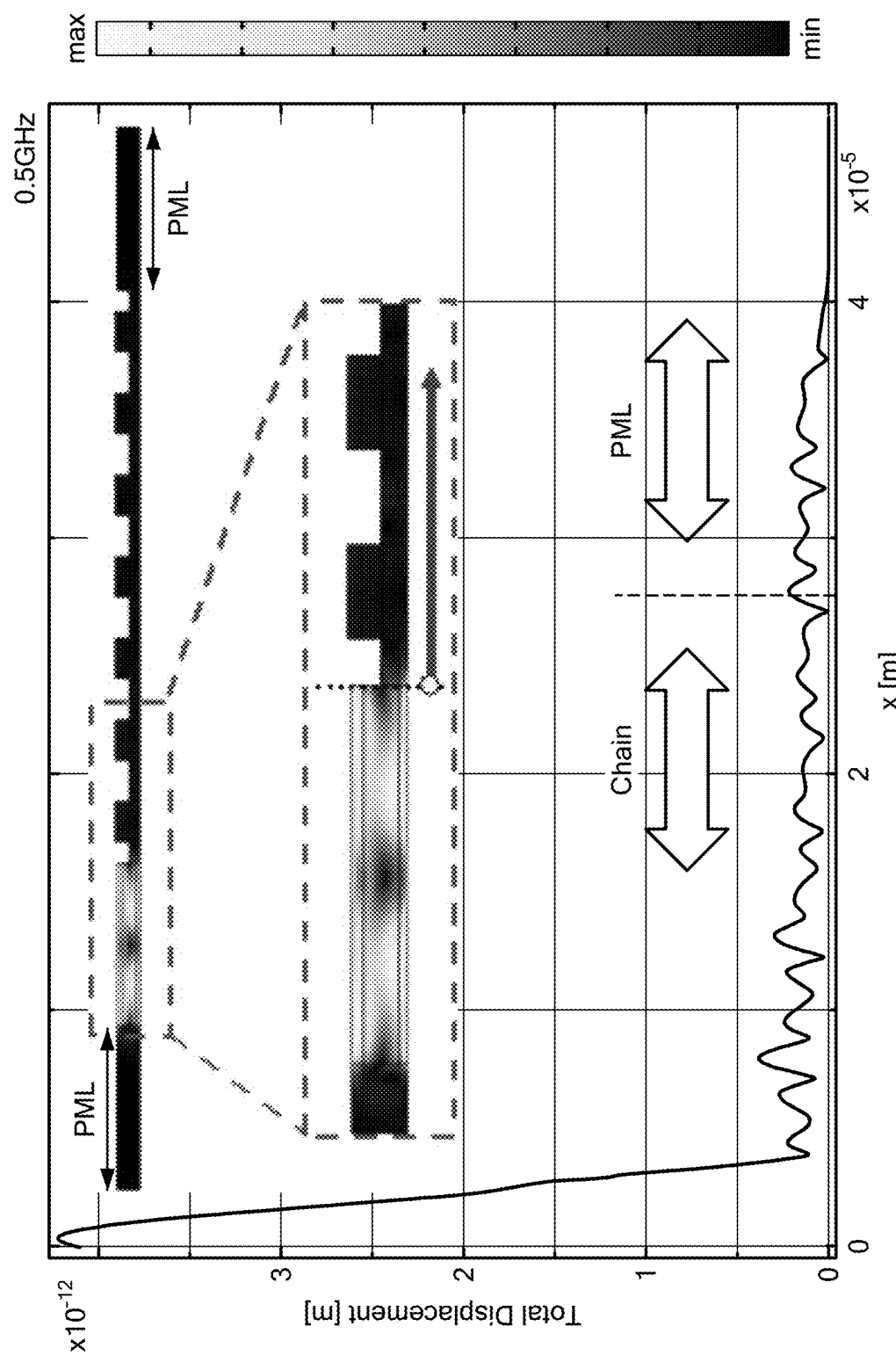
FIG. 10 illustrates FEM simulated modeshape of the total displacement in a chain of 7 unit-cells (FIGS. 1B, 1C), when this is driven, at 0.5 GHz, by one piezoelectric generator attached to it. The spatial total displacement distribution along a cut line, starting from the top-left edge of the closest unit-cell to the generator and ending at the top-right corner of the furthest PML, is also reported.

In order to clearly visualize the evanescent behavior of the investigated unit-cell, an ad-hoc FEM simulation framework was created to analyze the propagation characteristics exhibited by a chain of unit-cells, for frequencies included in three expected stopbands. This framework uses different piezoelectric generators to produce longitudinal vibrations at significantly different frequencies (2.4 GHz, 1.7 GHz and 500 MHz). This generator is attached, at one of its lateral side, to a perfectly-matched-layer (PML) while being connected, on the opposite side, to a chain of seven additional and electrically floating unit-cells (FIGS. 8-10). This chain acts as a delay line, separating the generator from an additional PML. FIGS. 8-10 report the generated modeshape relative to the magnitude of the total-displacement across the chain of unit-cells, for the three investigated frequencies. Also, the distribution of the total displacement along a cut horizontal line, starting from the top-left edge of the first unit-cell of the chain and ending at the edge of the furthest PML, is also reported, for the same investigated cases.

As evident, the simulated displacement profiles, across the unit-cells and relative to the three investigated cases, clearly exhibit the typical exponential decay that is expected by a delay-line operating in its evanescent operational region.

Measured Impact of the Trenches on $k_t^2$

Figure 13:
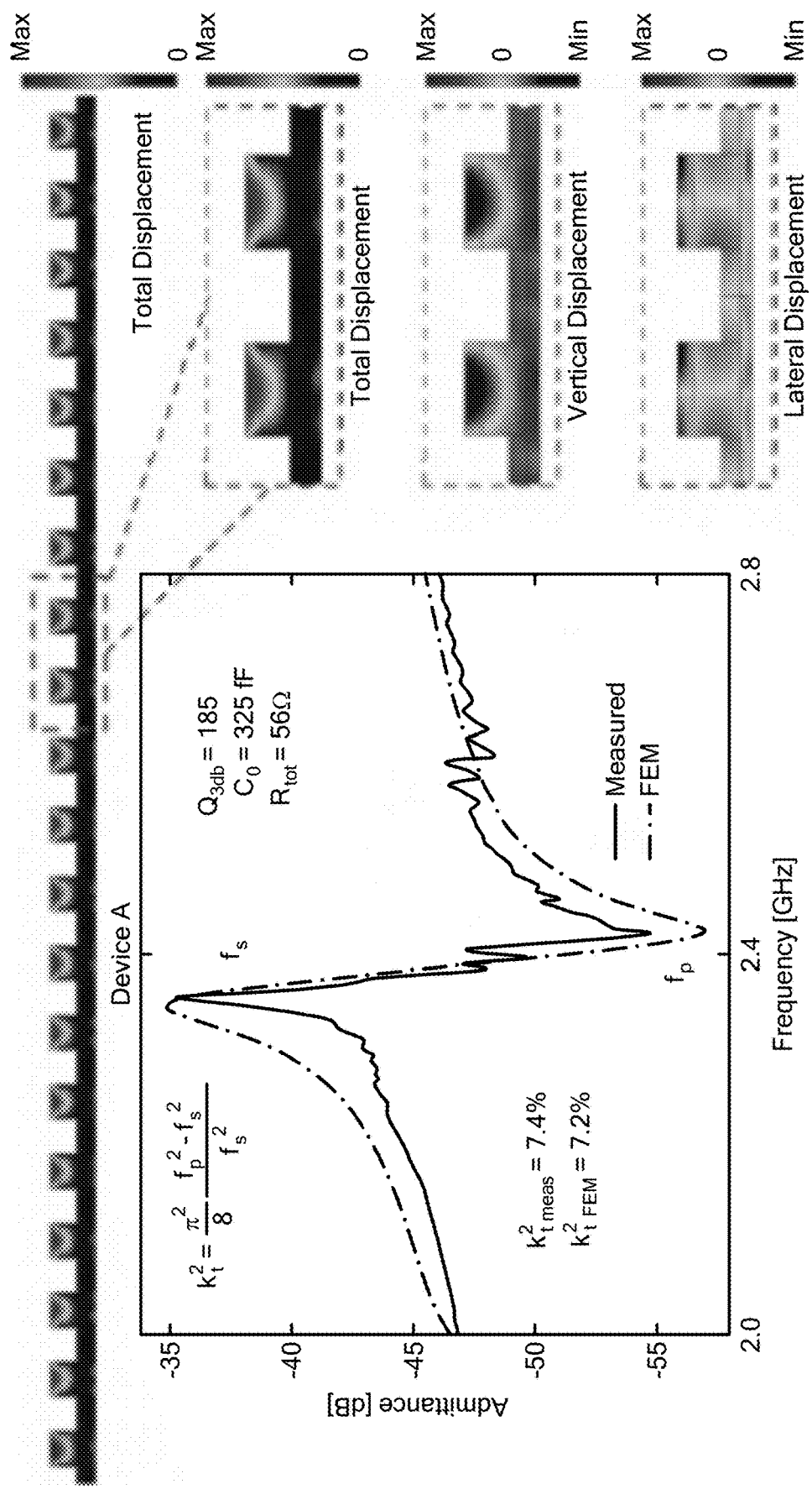
FIG. 13 illustrates measured (solid line) and FEM simulated (dashed line) admittance response for a fabricated 2DRR (Device A) (FIGS. 2-3). The device shows measured $k_t^2$, resistance at resonance ($R_{tot}=R_m+R_s$), loaded quality factor $Q_{3dB}$ (extracted from the 3 dB bandwidth) and $C_0$ in excess of 7.4%, 56Ω, 185 and 325 fF, respectively. The measured $k_t^2$ and $C_0$ match closely their FEM predicted values (7.2% and 300 fF, respectively). The device simulated modeshapes relative to its total, vertical and lateral resonant displacement components are also reported.
Figure 15:
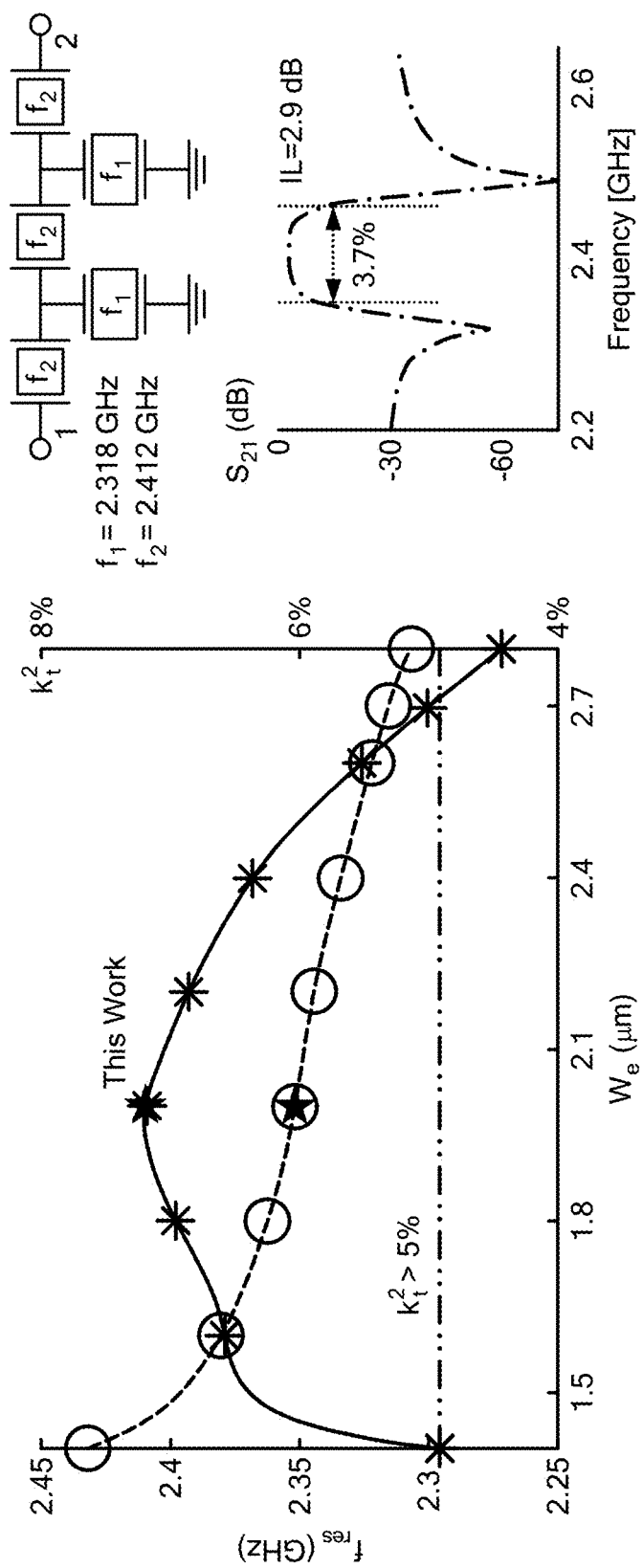
FIG. 15: FEM simulated trends of $f_{res}$ and $k_t^2$ vs. $W_e$ (FIG. 12). As evident, 2DRRs simultaneously enable a significant lithographic frequency tunability (>117 MHz) and a large $k_t^2$ exceeding 5%. This feature renders them suitable components to form monolithic integrated wideband filters for next-generation RF front-ends. As an example, the transmission scattering parameter ($S_{21}$) of a $5^{th}$-order 50Ω-matched ladder filter using 2DRRs exhibiting the same $Q_{3dB}$-value found in this work and a $k_t^2$-value extracted from FEM (see picture on the left) is reported. The simulated $S_{21}$-curve (see picture on the right) shows that 2DRRs enable RF filters simultaneously exhibiting insertion-loss (IL) lower than 2.9 dB, out-of-band rejection exceeding 30 dB and a wide fractional bandwidth (>3.7%).

To verify the high-$k_t^2$ attained by 2DRRs, a low-impedance (($\omega C_0$)$^{-1} \approx 208\Omega$) 2.35 GHz 2DRR (Device A) exhibiting a $k_t^2$-value in pair of 7.4% was built (FIGS. 3, 13). This device, which is formed by 20 unit-cells, shows measured $k_t^2$, resistance at resonance ($R_{tot}=R_m+R_s$), loaded quality factor $Q_{3dB}$ (extracted from the 3 dB bandwidth) and $C_0$ in excess of 7.4%, 56Ω, 185 and 325 fF (corresponding to an impedance of 208Ω), respectively. Such a high $k_t^2$-value matches closely the predicted one (7.2%) found through Finite Element Methods (FEM). In addition, the capability to lithographically define the resonance frequency of 2DRRs, without a substantial degradation of $k_t^2$ and without requiring additional fabrication steps, was demonstrated through FEM (FIG. 15).

Figure 11:
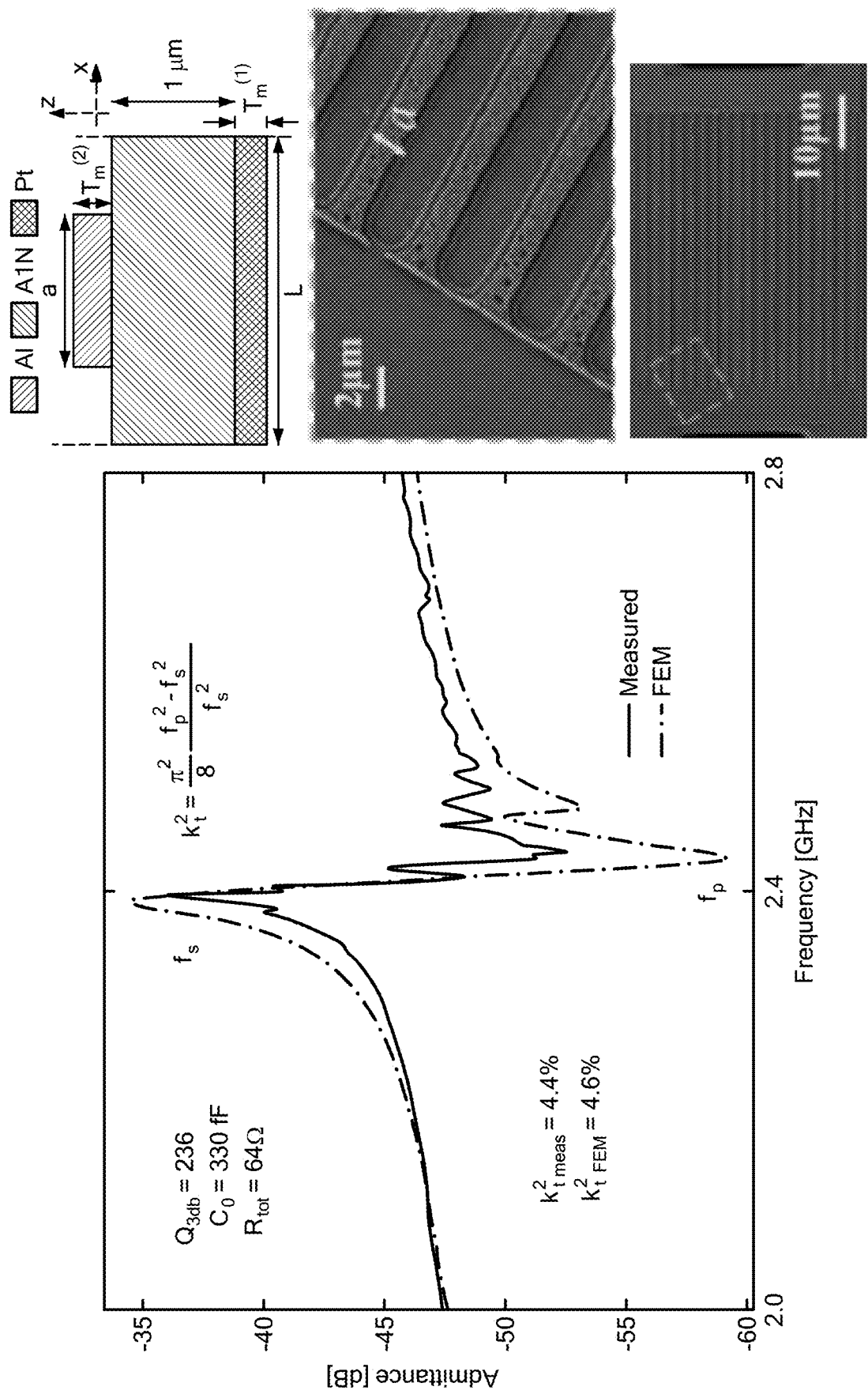
FIG. 11 illustrates measured (solid line) and FEM simulated (dashed line) admittance of a fabricated AlN device having active region characterized by the same material stack used by the fabricated 2DRR, but not using trenches between adjacent top metal strips. This device shows $k_t^2$, resistance at resonance ($R_{tot}=R_m+R_s$), loaded quality factor $Q_{3dB}$ (extracted from the 3 dB bandwidth) and $C_0$ in excess of 4.4%, 64Ω, 236 and 330 fF, respectively. The measured $k_t^2$ (4.6%) and $C_0$ (340 fF) values match closely their FEM predicted values. Also, the measured $Q_{3dB}$-value matches well the one attained by the reported 2DRR. This fact clearly shows that the quality factor found for both devices is not limited by the presence of the trenches.
Figure 12:
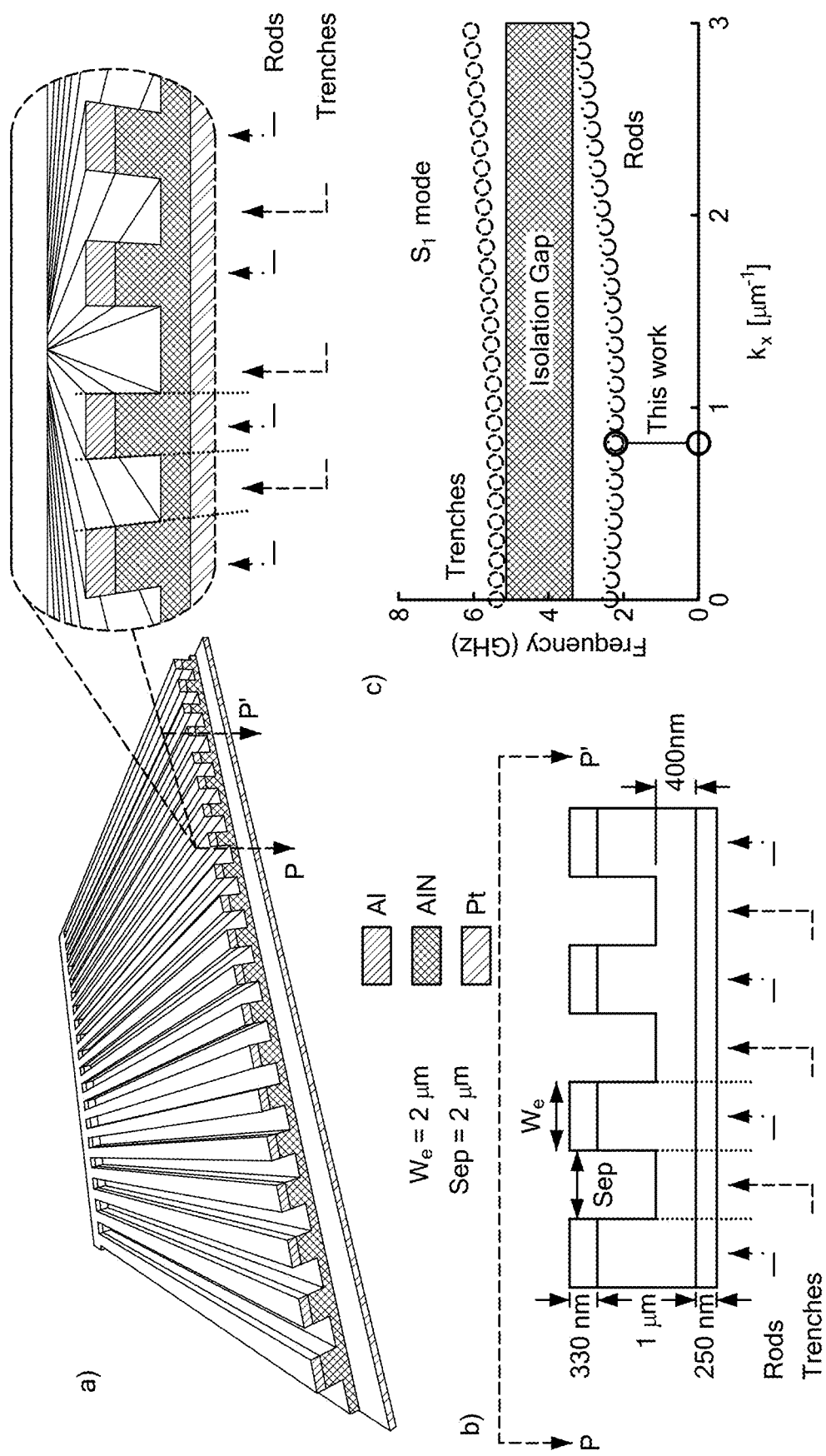
FIG. 12 illustrates a) Schematic views relative to the active region of the reported 2DRR (FIG. 13). The device is formed by a sets of metallized AlN rods (labeled "rods") connected through thinner AlN-beams (labeled "trenches") attained by forming trenches between the rods; b) Cross-sectional view of the active region of the reported 2DRR; c) FEM simulated dispersion curves of the frequency vs. lateral wavevector ($k_x$) relative to the S1-mode, for rods (line of closed circles) and trenches (line of open circles). As evident, a large isolation gap exists between the two derived curves. This feature makes the trenches unable to guide the modal energy created in the rods. So, as a first order of approximation, the trenches act as fixed constraints, thus trapping the acoustic energy in the rods. Consequently, the acoustic wavelength in the 2DRR becomes set by the width ($W_e$) of the rods.
Figure 14:
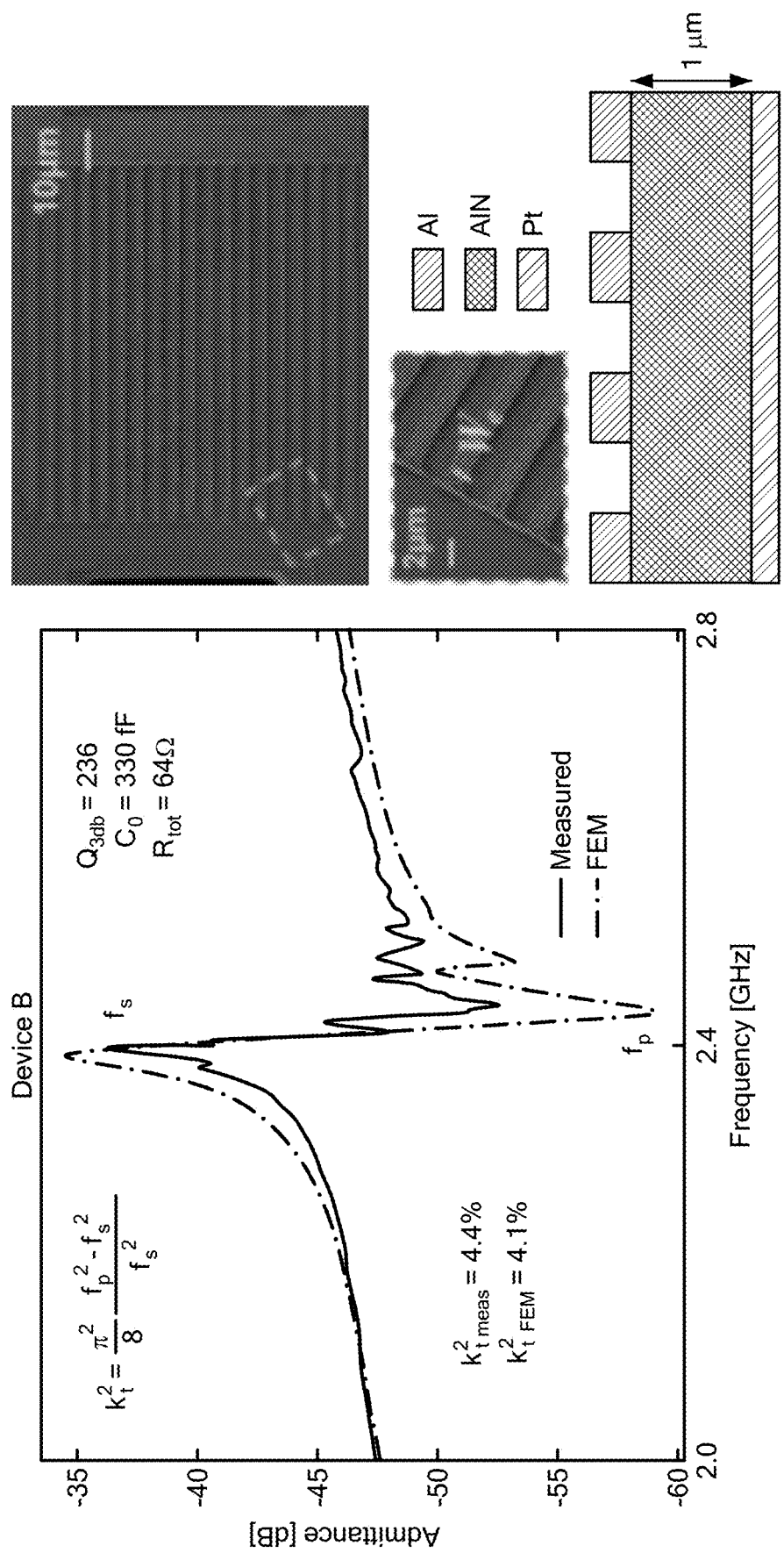
FIG. 14 illustrates: a) Measured (solid line) and FEM simulated (dashed line) admittance of a fabricated AlN device (Device B) having active region characterized by the same material stack used by the fabricated 2DRR (FIGS. 2-3; 13), but not using trenches between adjacent top metal strips. This device, which was fabricated on the same silicon wafer used for the reported 2DRR (FIG. 13), shows $k_t^2$, resistance at resonance ($R_{tot}=R_m+R_s$), loaded quality factor $Q_{3dB}$ (extracted from the 3 dB bandwidth) and $C_0$ in excess of 4.4%, 64Ω, 236 and 330 fF, respectively. The measured $k_t^2$ and $C_0$ values match closely their FEM predicted values (4.1%, 340 fF respectively). Also, the measured $Q_{3dB}$-value matches well the one attained by the reported 2DRR (FIG. 13). This fact clearly shows that the quality factor found for both devices is not limited by the presence of the trenches.

In order to experimentally demonstrate the impact of the trenches on the attainable $k_t^2$, a second device (Device B) (FIG. 14; see also FIG. 11), with the same geometrical and material characteristics, but not relying on any trench, was simultaneously fabricated on the same silicon wafer than the reported 2DRR. As expected, this device showed a significantly lower $k_t^2$ (<4.4%) than attained by the fabricated 2DRR. Also, it showed a resistance at resonance ($R_{tot}=R_m+R_s$, being $R_m$ and $R_s$ its motional and series resistance, respectively), a loaded quality factor $Q_{3dB}$ (extracted from the 3 dB bandwidth) and a $C_0$-value (being its static capacitance) in excess of 64Ω, 236 and 330 fF, respectively. The measured $k_t^2$ and $C_0$ values for this device match closely their FEM predicted values (4.6%, 340 fF respectively). Also, the measured $Q_{3dB}$-value for this device matches well the one attained by the reported 2DRR (see FIG. 3 described above). This fact clearly shows that the quality factor that was found for both this device and the 2DRR reported above is not limited by the presence of the trenches.

As used herein, "consisting essentially of" allows the inclusion of materials or steps that do not materially affect the basic and novel characteristics of the claim. Any recitation herein of the term "comprising," particularly in a description of components of a composition or in a description of elements of a device, can be exchanged with "consisting essentially of" or "consisting of."

To the extent that the appended claims have been drafted without multiple dependencies, this has been done only to accommodate formal requirements in jurisdictions that do not allow such multiple dependencies. It should be noted that all possible combinations of features that would be implied by rendering the claims multiply dependent are explicitly envisaged and should be considered part of the invention.

The present technology has been described in conjunction with certain preferred embodiments and aspects. It is to be understood that the technology is not limited to the exact details of construction, operation, exact materials or embodiments or aspects shown and described, and that various modifications, substitution of equivalents, alterations to the compositions, and other changes to the embodiments and aspects disclosed herein will be apparent to one of skill in the art.

What is claimed is:

1. A resonator device comprising:
   a piezoelectric layer suspended from a substrate, the piezoelectric layer having a width direction, a length direction, and a thickness direction, the piezoelectric layer having a bottom surface and a top surface, the piezoelectric layer comprising a beam extending along the bottom surface continuously in the width direction and the length direction, a plurality of rod portions extending continuously in the length direction and upwardly from the beam to the top surface, the plurality of rod portions spaced apart in the width direction;
   a bottom electrode comprising a metal plate in contact with the bottom surface of the piezoelectric layer; and
   a top electrode comprising a metal grating comprising a plurality of conductive strips on the top surface of the piezoelectric layer, each of the conductive strips aligned in contact with a corresponding one of the plurality of rod portions of the piezoelectric layer;
   wherein the plurality of conductive strips and corresponding ones of the plurality of rod portions of the piezoelectric layer form a plurality of rods, and portions of the beam of the piezoelectric layer and the bottom electrode form a plurality of trenches between the plurality of rods; and
   wherein the device has an electromechanical coupling coefficient between electrical and acoustic energy of at least 7%.

2. The resonator device of claim 1, wherein a thickness of each of the plurality of rods is greater than a thickness of each of the trenches.

3. The resonator device of claim 1, wherein a thickness of each of the plurality of rod portions of the piezoelectric layer is greater than a thickness of the piezoelectric layer of each of the trenches.

4. The resonator device of claim 1, wherein each of the trenches has a depth in the thickness direction selected to constrain acoustic energy within the plurality of rods.

5. The resonator device of claim 1, wherein each of the plurality of rods has a width selected to provide a determined frequency.

6. The resonator device of claim 5, wherein each of the trenches has a width selected to optimize the determined frequency of the plurality of rods.

7. The resonator device of claim 1, wherein the plurality of rods and the trenches each have an equal width within ±1%.

8. The device of claim 1, further comprising circuitry in communication with the resonator device to apply an alternating voltage through the top electrode and the bottom electrode to excite one or more dilatational modes of mechanical vibration in the plurality of rods of the piezoelectric layer.

9. The resonator device of claim 1, wherein the piezoelectric layer is selected from aluminum nitride, lead zirconate titanate, lithium niobate, lithium tantalite, zinc oxide, gallium nitride, scandium nitride, aluminum scandium nitride, and quartz, and combinations thereof.

10. The resonator device of claim 1, wherein the top electrode and the bottom electrode are each selected from aluminum, platinum, ruthenium, molybdenum, tungsten, and gold, and combinations thereof.

11. The resonator device of claim 1, wherein the piezoelectric layer is aluminum nitride, the bottom electrode is platinum, and the top electrode is aluminum.

12. A radio frequency (RF) component including the resonator device of claim 1, and electrical connections to the resonator device, wherein the RF component is a filter, oscillator, synthesizer, sensor, coupler, or transformer.

13. A filter comprising the resonator device of claim 1, and electrical connections to the resonator device.

* * * * *